(12) United States Patent
Shu et al.

(10) Patent No.: US 11,227,653 B1
(45) Date of Patent: Jan. 18, 2022

(54) STORAGE ARRAY CIRCUITS AND METHODS FOR COMPUTATIONAL MEMORY CELLS

(71) Applicant: GSI TECHNOLOGY, INC., Sunnyvale, CA (US)

(72) Inventors: Lee-Lean Shu, Sunnyvale, CA (US); Park Soon-Kyu, Sunnyvale, CA (US); Paul M. Chiang, Sunnyvale, CA (US)

(73) Assignee: GSI Technology, inc., Sunnyvale, CA (US)

( * ) Notice: Subject to any disclaimer, the term of this patent is extended or adjusted under 35 U.S.C. 154(b) by 0 days.

(21) Appl. No.: 15/997,250

(22) Filed: Jun. 4, 2018

Related U.S. Application Data

(63) Continuation-in-part of application No. 15/709,399, filed on Sep. 19, 2017, now Pat. No. 10,998,040, and a continuation-in-part of application No. 15/709,401, filed on Sep. 19, 2017, now Pat. No. 10,249,362, and a continuation-in-part of application No. 15/709,379, filed on Sep. 19, 2017, now Pat. No. 10,521,229, and a continuation-in-part of application No. 15/709,382, filed on Sep. 19, 2017, now Pat. No. 10,725,777, and a continuation-in-part of application No. 15/709,385, filed on Sep. 19, 2017, now Pat. No. 10,860,318.

(60) Provisional application No. 62/430,767, filed on Dec. 6, 2016, provisional application No. 62/430,762, filed on Dec. 6, 2016.

(51) Int. Cl.
  *G11C 11/419* (2006.01)
  *G06F 9/30* (2018.01)
  *G11C 11/418* (2006.01)

(52) U.S. Cl.
  CPC ........ *G11C 11/419* (2013.01); *G06F 9/30029* (2013.01); *G06F 9/30043* (2013.01); *G11C 11/418* (2013.01)

(58) Field of Classification Search
  CPC ...... G11C 11/41; G11C 11/418; G11C 11/419
  USPC .................................... 365/156, 154, 189.15
  See application file for complete search history.

(56) References Cited

U.S. PATENT DOCUMENTS

| | | | |
|---|---|---|---|
| 3,451,694 | A | 6/1969 | Hass |
| 3,747,952 | A | 7/1973 | Graebe |
| 3,795,412 | A | 3/1974 | John |
| 4,227,717 | A | 10/1980 | Bouvier |
| 4,308,505 | A | 12/1981 | Messerschmitt |
| 4,587,496 | A | 5/1986 | Wolaver |
| 4,594,564 | A | 6/1986 | Yarborough, Jr. |

(Continued)

FOREIGN PATENT DOCUMENTS

| | | |
|---|---|---|
| CN | 104752431 | 7/2015 |
| DE | 10133281 A1 | 1/2002 |
| JP | 2005-346922 | 12/2005 |

OTHER PUBLICATIONS

US 10,564,982 B1, 02/2020, Oh et al. (withdrawn)
(Continued)

*Primary Examiner* — Alfredo Bermudez Lozada
(74) *Attorney, Agent, or Firm* — DLA Piper LLP (US)

(57) ABSTRACT

A storage array for computational memory cells formed as a memory/processing array provides storage of the data without using the more complicated computational memory cells for storage. The storage array may have multiple columns of the storage cells coupled to a column of the computational memory cells. The storage array may have ECC circuitry.

32 Claims, 16 Drawing Sheets

(56) References Cited

U.S. PATENT DOCUMENTS

| | | | |
|---|---|---|---|
| 4,677,394 A | | 6/1987 | Vollmer |
| 4,716,322 A | | 12/1987 | D'Arrigo et al. |
| 4,741,006 A | | 4/1988 | Yamaguchi et al. |
| 4,856,035 A | | 8/1989 | Lewis |
| 5,008,636 A | | 4/1991 | Markinson |
| 5,302,916 A | | 4/1994 | Pritchett |
| 5,375,089 A | * | 12/1994 | Lo .................... G11C 8/16 365/189.04 |
| 5,382,922 A | | 1/1995 | Gersbach |
| 5,400,274 A | * | 3/1995 | Jones .................... G11C 7/10 365/189.02 |
| 5,473,574 A | | 12/1995 | Clemen et al. |
| 5,530,383 A | | 6/1996 | May |
| 5,535,159 A | | 7/1996 | Nii |
| 5,563,834 A | | 10/1996 | Longway et al. |
| 5,587,672 A | | 12/1996 | Ranganathan et al. |
| 5,608,354 A | | 3/1997 | Hori |
| 5,661,419 A | | 8/1997 | Bhagwan |
| 5,696,468 A | | 12/1997 | Nise |
| 5,736,872 A | | 4/1998 | Sharma et al. |
| 5,744,979 A | | 4/1998 | Goetting |
| 5,744,991 A | | 4/1998 | Jefferson et al. |
| 5,748,044 A | | 5/1998 | Xue |
| 5,768,559 A | | 6/1998 | Lino et al. |
| 5,805,912 A | | 9/1998 | Johnson et al. |
| 5,883,853 A | | 3/1999 | Zheng et al. |
| 5,937,204 A | | 8/1999 | Schinnerer |
| 5,942,949 A | | 8/1999 | Wilson et al. |
| 5,963,059 A | | 10/1999 | Partovi et al. |
| 5,969,576 A | | 10/1999 | Trodden |
| 5,969,986 A | | 10/1999 | Wong |
| 5,977,801 A | | 11/1999 | Boerstler |
| 5,999,458 A | | 12/1999 | Nishimura et al. |
| 6,005,794 A | | 12/1999 | Sheffield et al. |
| 6,044,034 A | | 3/2000 | Katakura |
| 6,058,063 A | | 5/2000 | Jang |
| 6,072,741 A | | 6/2000 | Taylor |
| 6,100,721 A | | 8/2000 | Durec et al. |
| 6,100,736 A | | 8/2000 | Wu et al. |
| 6,114,920 A | | 9/2000 | Moon et al. |
| 6,115,320 A | | 9/2000 | Mick et al. |
| 6,133,770 A | | 10/2000 | Hasegawa |
| 6,167,487 A | | 12/2000 | Camacho |
| 6,175,282 B1 | | 1/2001 | Yasuda |
| 6,226,217 B1 | | 5/2001 | Riedlinger et al. |
| 6,262,937 B1 | | 7/2001 | Arcoleo et al. |
| 6,263,452 B1 | | 7/2001 | Jewett et al. |
| 6,265,902 B1 | | 7/2001 | Klemmer et al. |
| 6,286,077 B1 | | 9/2001 | Choi et al. |
| 6,310,880 B1 | | 10/2001 | Waller |
| 6,366,524 B1 | | 4/2002 | Abedifard |
| 6,377,127 B1 | | 4/2002 | Fukaishi et al. |
| 6,381,684 B1 | | 4/2002 | Hronik et al. |
| 6,385,122 B1 | | 5/2002 | Chang |
| 6,407,642 B2 | | 6/2002 | Dosho et al. |
| 6,418,077 B1 | | 7/2002 | Naven |
| 6,441,691 B1 | | 8/2002 | Jones et al. |
| 6,448,757 B2 | | 9/2002 | Hill |
| 6,473,334 B1 | | 10/2002 | Bailey et al. |
| 6,483,361 B1 | | 11/2002 | Chiu |
| 6,504,417 B1 | | 1/2003 | Cecchi et al. |
| 6,538,475 B1 | | 3/2003 | Johansen et al. |
| 6,567,338 B1 | | 5/2003 | Mick |
| 6,594,194 B2 | | 7/2003 | Gold |
| 6,642,747 B1 | | 11/2003 | Chiu |
| 6,661,267 B2 | | 12/2003 | Walker et al. |
| 6,665,222 B2 | | 12/2003 | Wright et al. |
| 6,683,502 B1 | | 1/2004 | Groen et al. |
| 6,683,930 B1 | | 1/2004 | Dalmia |
| 6,732,247 B2 | | 5/2004 | Berg et al. |
| 6,744,277 B1 | | 6/2004 | Chang et al. |
| 6,757,854 B1 | | 6/2004 | Zhao |
| 6,789,209 B1 | | 9/2004 | Suzuki et al. |
| 6,816,019 B2 | | 11/2004 | Delbo' et al. |
| 6,836,419 B2 | | 12/2004 | Loughmiller |
| 6,838,951 B1 | | 1/2005 | Nieri et al. |
| 6,842,396 B2 | | 1/2005 | Kono |
| 6,853,696 B1 | | 2/2005 | Moser et al. |
| 6,854,059 B2 | | 2/2005 | Gardner |
| 6,856,202 B2 | | 2/2005 | Lesso |
| 6,859,107 B1 | | 2/2005 | Moon et al. |
| 6,882,237 B2 | | 4/2005 | Singh et al. |
| 6,897,696 B2 | | 5/2005 | Chang et al. |
| 6,933,789 B2 | | 8/2005 | Molnar et al. |
| 6,938,142 B2 | | 8/2005 | Pawlowski |
| 6,940,328 B2 | | 9/2005 | Lin |
| 6,954,091 B2 | | 10/2005 | Wurzer |
| 6,975,554 B1 | | 12/2005 | Lapidus et al. |
| 6,998,922 B2 | | 2/2006 | Jensen et al. |
| 7,002,404 B2 | | 2/2006 | Gaggl et al. |
| 7,002,416 B2 | | 2/2006 | Pettersen et al. |
| 7,003,065 B2 | | 2/2006 | Homol et al. |
| 7,017,090 B2 | | 3/2006 | Endou et al. |
| 7,019,569 B2 | | 3/2006 | Fan-Jiang |
| 7,042,271 B2 | | 5/2006 | Chung et al. |
| 7,042,792 B2 | | 5/2006 | Lee et al. |
| 7,042,793 B2 | | 5/2006 | Masuo |
| 7,046,093 B1 | | 5/2006 | McDonagh et al. |
| 7,047,146 B2 | | 5/2006 | Chuang et al. |
| 7,053,666 B2 | | 5/2006 | Tak et al. |
| 7,095,287 B2 | | 8/2006 | Maxim et al. |
| 7,099,643 B2 | | 8/2006 | Lin |
| 7,141,961 B2 | | 11/2006 | Hirayama et al. |
| 7,142,477 B1 | | 11/2006 | Tran et al. |
| 7,152,009 B2 | | 12/2006 | Bokui et al. |
| 7,180,816 B2 | | 2/2007 | Park |
| 7,200,713 B2 | | 4/2007 | Cabot et al. |
| 7,218,157 B2 | | 5/2007 | Van De Beek et al. |
| 7,233,214 B2 | | 6/2007 | Kim et al. |
| 7,246,215 B2 | | 7/2007 | Lu et al. |
| 7,263,152 B2 | | 8/2007 | Miller et al. |
| 7,269,402 B2 | | 9/2007 | Uozumi et al. |
| 7,282,999 B2 | | 10/2007 | Da Dalt et al. |
| 7,312,629 B2 | | 12/2007 | Chuang et al. |
| 7,313,040 B2 | | 12/2007 | Chuang et al. |
| 7,330,080 B1 | | 2/2008 | Stoiber et al. |
| 7,340,577 B1 | | 3/2008 | Van Dyke et al. |
| 7,349,515 B1 | | 3/2008 | Chew et al. |
| 7,352,249 B2 | | 4/2008 | Balboni et al. |
| 7,355,482 B2 | | 4/2008 | Meltzer |
| 7,355,907 B2 | | 4/2008 | Chen et al. |
| 7,369,000 B2 | | 5/2008 | Wu et al. |
| 7,375,593 B2 | | 5/2008 | Self |
| 7,389,457 B2 | | 6/2008 | Chen et al. |
| 7,439,816 B1 | | 10/2008 | Lombaard |
| 7,463,101 B2 | | 12/2008 | Tung |
| 7,464,282 B1 | | 12/2008 | Abdollahi-Alibeik et al. |
| 7,487,315 B2 | | 2/2009 | Hur et al. |
| 7,489,164 B2 | | 2/2009 | Madurawe |
| 7,512,033 B2 | | 3/2009 | Hur et al. |
| 7,516,385 B2 | | 4/2009 | Chen et al. |
| 7,538,623 B2 | | 5/2009 | Jensen et al. |
| 7,545,223 B2 | | 6/2009 | Watanabe |
| 7,565,480 B2 | | 7/2009 | Ware et al. |
| 7,577,225 B2 | | 8/2009 | Azadet et al. |
| 7,592,847 B2 | | 9/2009 | Liu et al. |
| 7,595,657 B2 | | 9/2009 | Chuang et al. |
| 7,622,996 B2 | | 11/2009 | Liu |
| 7,630,230 B2 | | 12/2009 | Wong |
| 7,633,322 B1 | | 12/2009 | Zhuang et al. |
| 7,635,988 B2 | | 12/2009 | Madurawe |
| 7,646,215 B2 | | 1/2010 | Chuang et al. |
| 7,646,648 B2 | | 1/2010 | Arsovski |
| 7,659,783 B2 | | 2/2010 | Tai |
| 7,660,149 B2 | | 2/2010 | Liaw |
| 7,663,415 B2 | | 2/2010 | Chatterjee et al. |
| 7,667,678 B2 | | 2/2010 | Guttag |
| 7,675,331 B2 | | 3/2010 | Jung et al. |
| 7,719,329 B1 | | 5/2010 | Smith |
| 7,719,330 B2 | | 5/2010 | Lin et al. |
| 7,728,675 B1 | | 6/2010 | Kennedy et al. |
| 7,737,743 B1 | | 6/2010 | Gao et al. |
| 7,746,181 B1 | | 6/2010 | Moyal |
| 7,746,182 B2 | | 6/2010 | Ramaswamy et al. |

(56) References Cited

U.S. PATENT DOCUMENTS

| | | |
|---|---|---|
| 7,750,683 B2 | 7/2010 | Huang et al. |
| 7,760,032 B2 | 7/2010 | Ardehali |
| 7,760,040 B2 | 7/2010 | Zhang et al. |
| 7,760,532 B2 | 7/2010 | Shirley et al. |
| 7,782,655 B2 | 8/2010 | Shau |
| 7,812,644 B2 | 10/2010 | Cha et al. |
| 7,813,161 B2 | 10/2010 | Luthra |
| 7,830,212 B2 | 11/2010 | Lee et al. |
| 7,839,177 B1 | 11/2010 | Soh |
| 7,843,239 B2 | 11/2010 | Sohn et al. |
| 7,843,721 B1 | 11/2010 | Chou |
| 7,848,725 B2 | 12/2010 | Zolfaghari et al. |
| 7,859,919 B2 | 12/2010 | De La Cruz, II et al. |
| 7,876,163 B2 | 1/2011 | Hachigo |
| 7,916,554 B2 | 3/2011 | Pawlowski |
| 7,920,409 B1 | 4/2011 | Clark |
| 7,920,665 B2 | 4/2011 | Lombaard |
| 7,924,599 B1 | 4/2011 | Evans, Jr. et al. |
| 7,940,088 B1 | 5/2011 | Sampath et al. |
| 7,944,256 B2 | 5/2011 | Masuda |
| 7,956,695 B1 | 6/2011 | Ding et al. |
| 7,965,108 B2 | 6/2011 | Liu et al. |
| 8,004,920 B2 | 8/2011 | Ito et al. |
| 8,008,956 B1 | 8/2011 | Shin et al. |
| 8,044,724 B2 | 10/2011 | Rao et al. |
| 8,063,707 B2 | 11/2011 | Wang |
| 8,087,690 B2 | 1/2012 | Kim |
| 8,089,819 B2 | 1/2012 | Noda |
| 8,117,567 B2 | 2/2012 | Arsovski |
| 8,174,332 B1 | 5/2012 | Lombaard et al. |
| 8,218,707 B2 | 7/2012 | Mai |
| 8,242,820 B2 | 8/2012 | Kim |
| 8,258,831 B1 | 9/2012 | Banai |
| 8,284,593 B2 | 10/2012 | Russell |
| 8,294,502 B2 | 10/2012 | Lewis et al. |
| 8,400,200 B1 | 3/2013 | Kim et al. |
| 8,488,408 B1 | 7/2013 | Shu et al. |
| 8,493,774 B2 | 7/2013 | Kung |
| 8,526,256 B2 | 9/2013 | Ghosh |
| 8,542,050 B2 | 9/2013 | Chuang et al. |
| 8,575,982 B1 | 11/2013 | Shu et al. |
| 8,593,860 B2 | 11/2013 | Shu et al. |
| 8,625,334 B2 | 1/2014 | Liaw |
| 8,643,418 B2 | 2/2014 | Ma et al. |
| 8,692,621 B2 | 4/2014 | Snowden et al. |
| 8,693,236 B2 | 4/2014 | Shu |
| 8,817,550 B1 | 8/2014 | Oh |
| 8,837,207 B1 | 9/2014 | Jou |
| 8,885,439 B1 | 11/2014 | Shu et al. |
| 8,971,096 B2 | 3/2015 | Jung et al. |
| 8,995,162 B2 | 3/2015 | Sang |
| 9,018,992 B1 | 4/2015 | Shu et al. |
| 9,030,893 B2 | 5/2015 | Jung |
| 9,053,768 B2 | 6/2015 | Shu et al. |
| 9,059,691 B2 | 6/2015 | Lin |
| 9,070,477 B1 | 6/2015 | Clark |
| 9,083,356 B1 | 7/2015 | Cheng |
| 9,093,135 B2 | 7/2015 | Khailany |
| 9,094,025 B1 | 7/2015 | Cheng |
| 9,135,986 B2 | 9/2015 | Shu |
| 9,142,285 B2 | 9/2015 | Hwang et al. |
| 9,159,391 B1 | 10/2015 | Shu et al. |
| 9,171,634 B2 | 10/2015 | Zheng |
| 9,177,646 B2 | 11/2015 | Arsovski |
| 9,196,324 B2 | 11/2015 | Haig et al. |
| 9,240,229 B1 | 1/2016 | Oh et al. |
| 9,311,971 B1 | 4/2016 | Oh |
| 9,318,174 B1 | 4/2016 | Chuang et al. |
| 9,356,611 B1 | 5/2016 | Shu et al. |
| 9,384,822 B2 | 7/2016 | Shu et al. |
| 9,385,032 B2 | 7/2016 | Shu |
| 9,396,790 B1 | 7/2016 | Chhabra |
| 9,396,795 B1 | 7/2016 | Jeloka et al. |
| 9,401,200 B1 | 7/2016 | Chan |
| 9,412,440 B1 | 8/2016 | Shu et al. |
| 9,413,295 B1 | 8/2016 | Chang |
| 9,431,079 B1 | 8/2016 | Shu et al. |
| 9,443,575 B2 | 9/2016 | Yabuuchi |
| 9,484,076 B1 | 11/2016 | Shu et al. |
| 9,494,647 B1 | 11/2016 | Chuang et al. |
| 9,552,872 B2 | 1/2017 | Jung |
| 9,608,651 B1 | 3/2017 | Cheng |
| 9,613,670 B2 | 4/2017 | Chuang et al. |
| 9,613,684 B2 | 4/2017 | Shu et al. |
| 9,640,540 B1 | 5/2017 | Liaw |
| 9,679,631 B2 | 6/2017 | Haig et al. |
| 9,685,210 B1 | 6/2017 | Ghosh et al. |
| 9,692,429 B1 | 6/2017 | Chang et al. |
| 9,697,890 B1 | 7/2017 | Wang |
| 9,722,618 B1 | 8/2017 | Cheng |
| 9,729,159 B1 | 8/2017 | Cheng |
| 9,789,840 B2 | 10/2017 | Farooq |
| 9,804,856 B2 | 10/2017 | Oh et al. |
| 9,847,111 B2 | 12/2017 | Shu et al. |
| 9,853,633 B1 | 12/2017 | Cheng et al. |
| 9,853,634 B2 | 12/2017 | Chang |
| 9,859,902 B2 | 1/2018 | Chang |
| 9,916,889 B1 | 3/2018 | Duong |
| 9,935,635 B2 | 4/2018 | Kim et al. |
| 9,966,118 B2 | 5/2018 | Shu et al. |
| 10,153,042 B2 | 12/2018 | Ehrman |
| 10,192,592 B2 | 1/2019 | Shu et al. |
| 10,249,312 B2 | 4/2019 | Kim et al. |
| 10,249,362 B2 | 4/2019 | Shu et al. |
| 10,388,364 B2 | 8/2019 | Ishizu et al. |
| 10,425,070 B2 | 9/2019 | Cheng et al. |
| 10,521,229 B2 | 12/2019 | Shu et al. |
| 10,535,381 B2 | 1/2020 | Shu et al. |
| 10,659,058 B1 | 5/2020 | Cheng et al. |
| 10,673,440 B1 | 6/2020 | Camarota |
| 10,770,133 B1 | 9/2020 | Haig et al. |
| 10,777,262 B1 | 9/2020 | Haig et al. |
| 10,847,212 B1 | 11/2020 | Haig et al. |
| 10,847,213 B1 | 11/2020 | Haig et al. |
| 10,854,284 B1 | 12/2020 | Chuang et al. |
| 10,860,320 B1 | 12/2020 | Haig et al. |
| 10,877,731 B1 | 12/2020 | Shu et al. |
| 10,891,076 B1 | 1/2021 | Haig et al. |
| 10,930,341 B1 | 2/2021 | Shu et al. |
| 10,943,648 B1 | 3/2021 | Shu et al. |
| 2001/0052822 A1 | 12/2001 | Kim et al. |
| 2002/0006072 A1 | 1/2002 | Kunikiyo |
| 2002/0060938 A1 | 5/2002 | Song |
| 2002/0136074 A1 | 9/2002 | Hanzawa et al. |
| 2002/0154565 A1 | 10/2002 | Noh et al. |
| 2002/0168935 A1 | 11/2002 | Han |
| 2003/0016689 A1 | 1/2003 | Hoof |
| 2003/0107913 A1 | 6/2003 | Nii |
| 2003/0185329 A1 | 10/2003 | Dickmann |
| 2004/0053510 A1 | 3/2004 | Little |
| 2004/0062138 A1 | 4/2004 | Partsch et al. |
| 2004/0090413 A1 | 5/2004 | Yoo |
| 2004/0160250 A1 | 8/2004 | Kim et al. |
| 2004/0169565 A1 | 9/2004 | Gaggl et al. |
| 2004/0199803 A1 | 10/2004 | Suzuki et al. |
| 2004/0240301 A1 | 12/2004 | Rao |
| 2004/0264279 A1 | 12/2004 | Wordeman |
| 2004/0264286 A1 | 12/2004 | Ware et al. |
| 2005/0024912 A1 | 2/2005 | Chen et al. |
| 2005/0026329 A1 | 2/2005 | Kim et al. |
| 2005/0036394 A1 | 2/2005 | Shiraishi |
| 2005/0186930 A1 | 8/2005 | Rofougaran et al. |
| 2005/0226079 A1 | 10/2005 | Zhu et al. |
| 2005/0226357 A1 | 10/2005 | Yoshimura |
| 2005/0253658 A1 | 11/2005 | Maeda et al. |
| 2005/0285862 A1 | 12/2005 | Noda |
| 2006/0039227 A1 | 2/2006 | Lai et al. |
| 2006/0055434 A1 | 3/2006 | Tak et al. |
| 2006/0119443 A1 | 6/2006 | Azam et al. |
| 2006/0139105 A1 | 6/2006 | Maxim et al. |
| 2006/0143428 A1 | 6/2006 | Noda |
| 2006/0248305 A1 | 11/2006 | Fang |
| 2007/0001721 A1 | 1/2007 | Chen et al. |
| 2007/0047283 A1 | 3/2007 | Miyanishi |

(56) References Cited

U.S. PATENT DOCUMENTS

| | | |
|---|---|---|
| 2007/0058407 A1 | 3/2007 | Dosaka et al. |
| 2007/0109030 A1 | 5/2007 | Park |
| 2007/0115739 A1 | 5/2007 | Huang |
| 2007/0139997 A1 | 6/2007 | Suzuki |
| 2007/0171713 A1 | 7/2007 | Hunter |
| 2007/0189101 A1 | 8/2007 | Lambrache et al. |
| 2007/0229129 A1 | 10/2007 | Nakagawa |
| 2008/0010429 A1 | 1/2008 | Rao |
| 2008/0049484 A1 | 2/2008 | Sasaki |
| 2008/0068096 A1 | 3/2008 | Feng et al. |
| 2008/0079467 A1 | 4/2008 | Hou et al. |
| 2008/0080230 A1* | 4/2008 | Liaw .............. G11C 7/062 365/154 |
| 2008/0117707 A1 | 5/2008 | Manickavasakam |
| 2008/0129402 A1 | 6/2008 | Han et al. |
| 2008/0155362 A1 | 6/2008 | Chang et al. |
| 2008/0175039 A1 | 7/2008 | Thomas |
| 2008/0181029 A1 | 7/2008 | Joshi et al. |
| 2008/0265957 A1 | 10/2008 | Luong et al. |
| 2008/0273361 A1 | 11/2008 | Dudeck et al. |
| 2009/0027947 A1 | 1/2009 | Takeda |
| 2009/0089646 A1* | 4/2009 | Hirose .............. G11C 7/106 714/766 |
| 2009/0141566 A1 | 6/2009 | Arsovski |
| 2009/0154257 A1 | 6/2009 | Fukaisha et al. |
| 2009/0231943 A1 | 9/2009 | Kunce et al. |
| 2009/0256642 A1 | 10/2009 | Lesso |
| 2009/0296869 A1 | 12/2009 | Chao et al. |
| 2009/0319871 A1 | 12/2009 | Shirai et al. |
| 2010/0020590 A1 | 1/2010 | Hsueh et al. |
| 2010/0085086 A1 | 4/2010 | Nedovic et al. |
| 2010/0157715 A1* | 6/2010 | Pyeon .............. G11C 11/413 365/230.05 |
| 2010/0169675 A1 | 7/2010 | Kajihara |
| 2010/0172190 A1 | 7/2010 | Lavi |
| 2010/0177571 A1 | 7/2010 | Shori et al. |
| 2010/0214815 A1 | 8/2010 | Tam |
| 2010/0232202 A1 | 9/2010 | Lu |
| 2010/0260001 A1 | 10/2010 | Kasprak et al. |
| 2010/0271138 A1 | 10/2010 | Thakur et al. |
| 2010/0322022 A1 | 12/2010 | Shinozaki et al. |
| 2011/0018597 A1 | 1/2011 | Lee et al. |
| 2011/0063898 A1 | 3/2011 | Ong |
| 2011/0153932 A1 | 6/2011 | Ware et al. |
| 2011/0211401 A1 | 9/2011 | Chan et al. |
| 2011/0267914 A1 | 11/2011 | Ish Iku Ra |
| 2011/0280307 A1 | 11/2011 | Macinnis et al. |
| 2011/0292743 A1 | 12/2011 | Zimmerman |
| 2011/0299353 A1 | 12/2011 | Ito et al. |
| 2012/0049911 A1 | 3/2012 | Ura |
| 2012/0133114 A1 | 5/2012 | Choi et al. |
| 2012/0153999 A1 | 6/2012 | Kim |
| 2012/0242382 A1 | 9/2012 | Tsuchiya et al. |
| 2012/0243347 A1 | 9/2012 | Sampigethaya |
| 2012/0250440 A1 | 10/2012 | Wu |
| 2012/0281459 A1 | 11/2012 | Teman et al. |
| 2012/0327704 A1 | 12/2012 | Chan |
| 2013/0039131 A1 | 2/2013 | Haig et al. |
| 2013/0083591 A1* | 4/2013 | Wuu .............. G11C 8/12 365/154 |
| 2013/0170289 A1 | 7/2013 | Grover et al. |
| 2014/0056093 A1 | 2/2014 | Tran et al. |
| 2014/0125390 A1 | 5/2014 | Ma |
| 2014/0136778 A1 | 5/2014 | Khailany et al. |
| 2014/0185366 A1 | 7/2014 | Chandwani et al. |
| 2014/0269019 A1 | 9/2014 | Kolar |
| 2015/0003148 A1 | 1/2015 | Iyer et al. |
| 2015/0029782 A1 | 1/2015 | Jung |
| 2015/0063052 A1 | 3/2015 | Manning |
| 2015/0187763 A1 | 7/2015 | Kim et al. |
| 2015/0213858 A1 | 7/2015 | Tao |
| 2015/0248927 A1 | 9/2015 | Fujiwara |
| 2015/0279453 A1 | 10/2015 | Fujiwara |
| 2015/0302917 A1 | 10/2015 | Grover |
| 2015/0310901 A1 | 10/2015 | Jung |
| 2015/0357028 A1 | 12/2015 | Huang et al. |
| 2016/0005458 A1 | 1/2016 | Shu et al. |
| 2016/0027500 A1 | 1/2016 | Chuang et al. |
| 2016/0064068 A1 | 3/2016 | Mojumder |
| 2016/0141023 A1 | 5/2016 | Jung |
| 2016/0225436 A1* | 8/2016 | Wang .............. G06F 11/076 |
| 2016/0225437 A1 | 8/2016 | Kumar et al. |
| 2016/0247559 A1 | 8/2016 | Atallah et al. |
| 2016/0284392 A1 | 9/2016 | Block et al. |
| 2016/0329092 A1 | 11/2016 | Akerib |
| 2017/0194046 A1 | 7/2017 | Yeung, Jr. et al. |
| 2017/0345505 A1* | 11/2017 | Noel .............. G11C 8/16 |
| 2018/0122456 A1 | 5/2018 | Li |
| 2018/0123603 A1 | 5/2018 | Chang |
| 2018/0157621 A1 | 6/2018 | Shu et al. |
| 2018/0158517 A1 | 6/2018 | Shu et al. |
| 2018/0158518 A1 | 6/2018 | Shu et al. |
| 2018/0158519 A1 | 6/2018 | Shu et al. |
| 2018/0158520 A1 | 6/2018 | Shu |
| 2020/0117398 A1 | 4/2020 | Haig et al. |
| 2020/0160905 A1 | 5/2020 | Charles et al. |
| 2020/0301707 A1 | 9/2020 | Shu et al. |
| 2020/0403616 A1 | 12/2020 | Shu et al. |
| 2021/0027815 A1 | 1/2021 | Shu et al. |
| 2021/0027834 A1 | 1/2021 | Haig et al. |

OTHER PUBLICATIONS

Wang et al., "A Two-Write and Two-Read Multi-Port SRAM with Shared Write Bit-Line Scheme and Selective Read Path for Low Power Operation", Journal of Low Power Electronics vol. 9. Sep. 22, 2013, Department of Electronics Engineering and Institute of Electronics, National Chiao-Tung University, Hsinchu 300, Taiwan (Received: Oct. 15, 2012: Accepted: Feb. 11, 2013), 14 pages.

\* cited by examiner

STORAGE ARRAY CIRCUITS AND METHODS FOR COMPUTATIONAL MEMORY CELLS

PRIORITY CLAIM/RELATED APPLICATIONS

This application is a continuation in part of and claims priority under 35 USC 120 to U.S. patent application Ser. No. 15/709,399, filed Sep. 19, 2017 and entitled "Computational Dual Port Sram Cell And Processing Array Device Using The Dual Port Sram Cells For Xor And Xnor Computations", U.S. patent application Ser. No. 15/709,401, filed Sep. 19, 2017 and entitled "Computational Dual Port Sram Cell And Processing Array Device Using The Dual Port Sram Cells For Xor And Xnor Computations", U.S. patent application Ser. No. 15/709,379, filed Sep. 19, 2017 and entitled "Computational Dual Port Sram Cell And Processing Array Device Using The Dual Port Sram Cells", U.S. patent application Ser. No. 15/709,382, filed Sep. 19, 2017 and entitled "Computational Dual Port Sram Cell And Processing Array Device Using The Dual Port Sram Cells", and U.S. patent application Ser. No. 15/709,385, filed Sep. 19, 2017 and entitled "Computational Dual Port Sram Cell And Processing Array Device Using The Dual Port Sram Cells" that in turn claim priority under 35 USC 119(e) and 120 and claim the benefit of U.S. Provisional Patent Application No. 62/430,767, filed Dec. 6, 2016 and entitled "Computational Dual Port Sram Cell And Processing Array Device Using The Dual Port Sram Cells For Xor And Xnor Computations" and U.S. Provisional Patent Application No. 62/430,762, filed Dec. 6, 2016 and entitled "Computational Dual Port Sram Cell And Processing Array Device Using The Dual Port Sram Cells", the entirety of all of which are incorporated herein by reference.

FIELD

The disclosure relates generally to a storage array for an array of computational memory elements.

BACKGROUND

Memory cells have traditionally been used to store bits of data. It is also possible to architect a memory cell so that the memory cell is able to perform some simple logical functions when multiple memory cells are connected to the same read bit line. For example, when memory cells A, B, and C are connected to a particular read bit line and are read simultaneously, and the memory cells and read bit line circuitry are designed to produce a logical AND result, then the result that appears on the read bit line is AND(a,b,c) (i.e. "a AND b AND c"), where a, b, and c represent the binary data values stored in memory cells A, B, and C respectively.

By themselves, these computational memory cells and read bit line circuitry allow for a single logical function (e.g. AND) to be performed across multiple memory cells connected to the same read bit line, when read simultaneously. However, in many cases, it is desirable to be able to store data associated with the computational memory cells. Since each computational memory cell is a dual port static random access memory (SRAM) cell, it would be inefficient to store data in the computational memory cells since these computational memory cells are significantly larger than other higher density memories. Thus, it is desirable to provide a storage array that is connected to an array of computational memory cells to store various data associated with the array of computational memory cells and it is to this end that the disclosure is directed.

DETAILED DESCRIPTION OF ONE OR MORE EMBODIMENTS

The disclosure is particularly applicable to a processing array, semiconductor memory or computer that utilizes a plurality of computational memory cells (with each cell being formed with a dual port static random access memory (SRAM) cell) and an array of storage cells (with each cell being formed with a 6T SRAM cell) to provide storage for the data associated with the plurality of computational memory cells and it is in this context that the disclosure will be described. It will be appreciated, however, that each computational memory cell may be formed using other types of volatile and non-volatile memory cell that are within the scope of the disclosure, that each storage cell may be formed using other types of volatile and non-volatile memory cell that are within the scope of the disclosure, that the well-known ECC circuitry may be implemented in various manner that are within the scope of the disclosure, that different computational memory cell architectures that those disclosed below are within the scope of the disclosure and that the combination of the array of computational memory cells and the array of storage cells may be formed on a single integrated circuit, or a single substrate or on different substrates or integrated circuits that are connected together.

The disclosure is directed to a memory/processing array of computational memory cells that has an array of storage cells connected to the array of computational memory cells. Each computational memory cell has a storage cell and a read bit line and the read bit lines of the computational memory cells in each column of computational memory cells are connected to a single read bit line that may be used to perform computations as described below. There may be two or more columns of storage cells in the storage array connected to each column of cells in the computational memory cell array. In some embodiments, the storage array may include error checking circuitry (ECC) and the storage array may store data bits and parity bits. In some embodiments, the storage array may have two columns of storage cells and a multiplexer connected to each column of computational memory cells while in other embodiments, the storage array may have four columns of storage cells and a multiplexer connected to each column of computational memory cells. In some embodiments, a global data line may be incorporated into the storage array. In some embodiments, the storage array may include 2 sets of ECCs.

Figure 1:
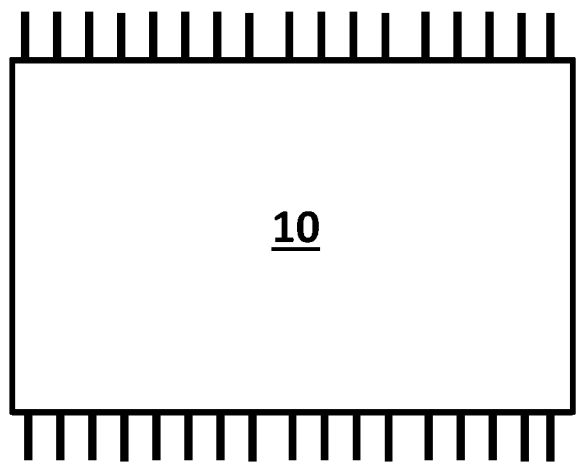
FIG. 1 illustrates an example of a semiconductor memory that may include a plurality of computation memory cells and a storage array.
Figure 2:
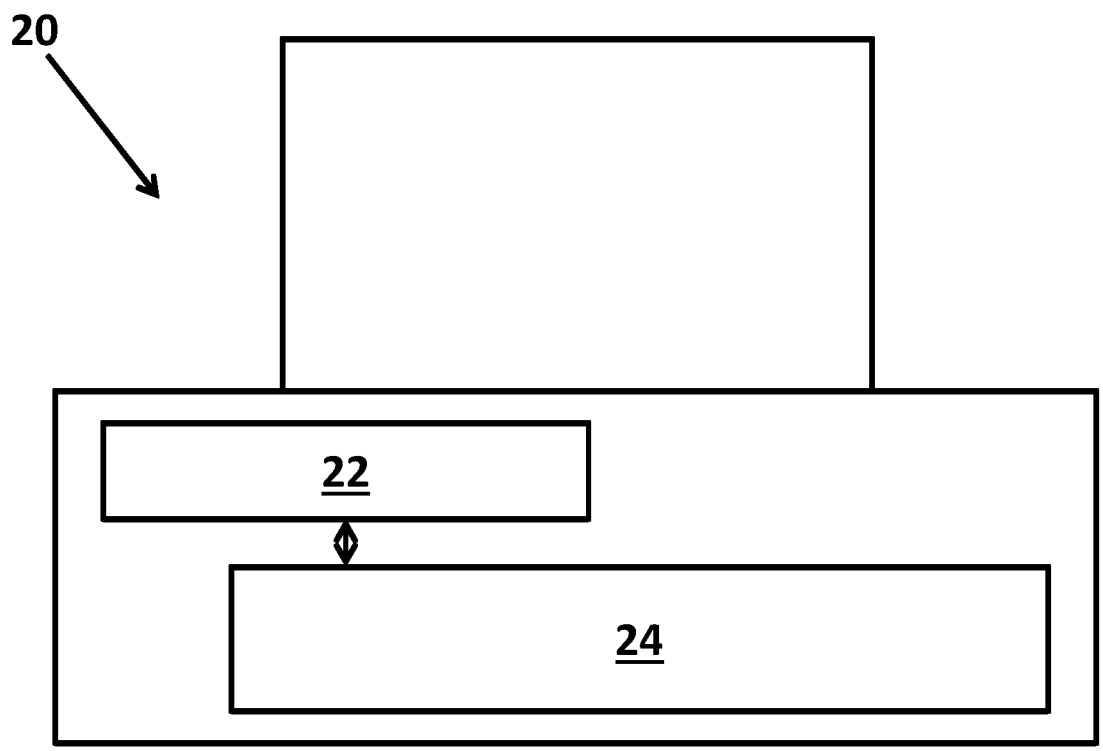
FIG. 2 illustrates an example of a computer system that may include a plurality of computation memory cells and a storage array.

FIG. 1 illustrates an example of a semiconductor memory 10 that may include a plurality of computation memory cells and a storage array that are described below in more detail wherein the plurality of computation memory cells and the storage array and other circuits are formed on the same substrate or integrated circuit. In other embodiments, the plurality of computation memory cells and circuitry may be formed on one substrate or integrated circuit and the storage array and circuits may be formed on another substrate or integrated circuit and the two substrates or integrated circuits may be connected to each other. The below disclosed plurality of computation memory cells and storage array allow the semiconductor memory 10 to perform more complex logic functions and data storage. FIG. 2 illustrates an example of a computer system 20 that may include a plurality of computation memory cells, the storage array and circuitry that are described below in more detail. The below disclosed plurality of computation memory cells and storage array allow the computer system 20 to perform more complex logic functions and storage than are possible with just the plurality of computation memory cells. The computer system 20 may have at least one processor 22 and a memory 24 that may include the plurality of computation memory cells, storage array and circuitry.

Figure 3A:
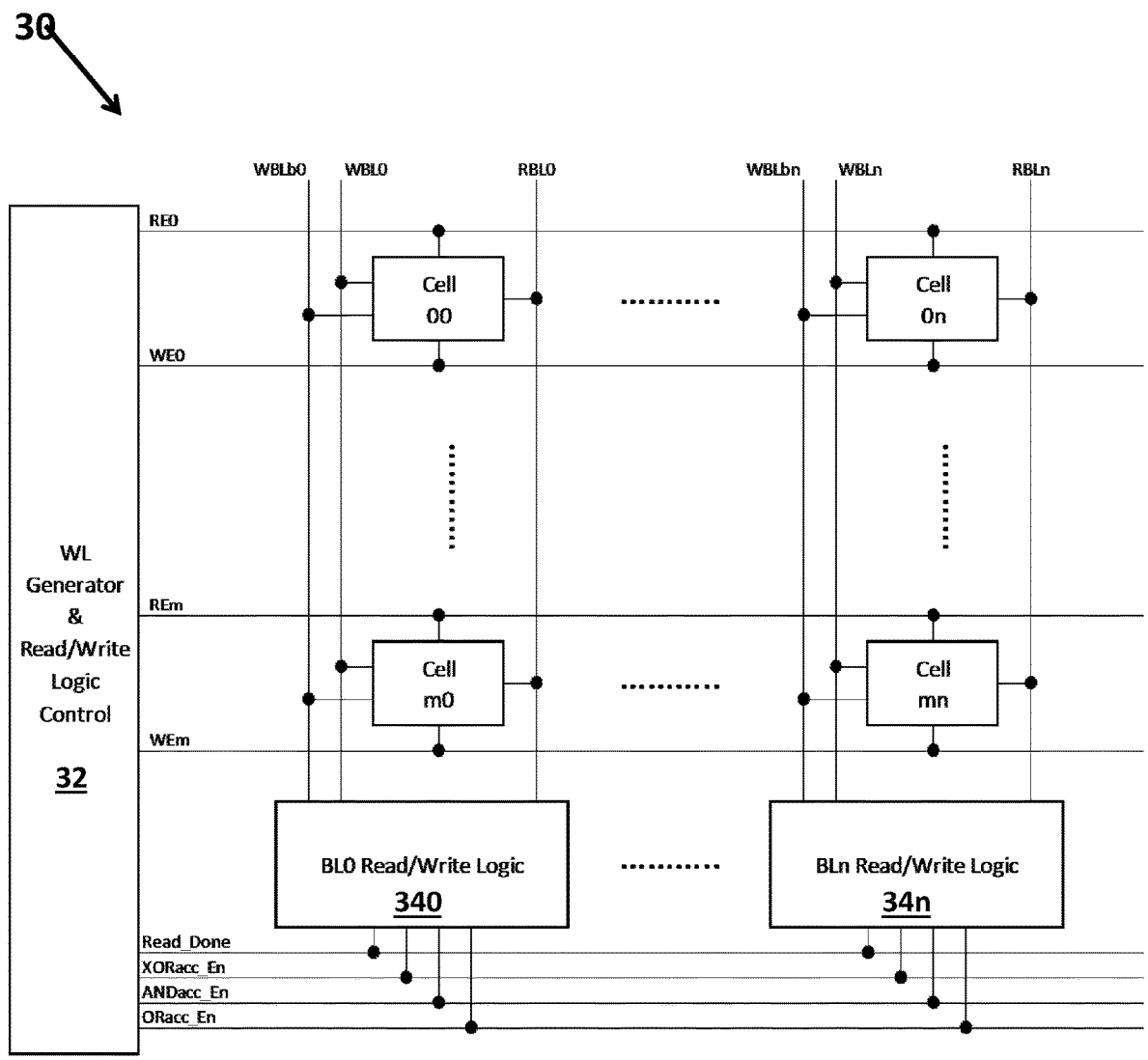
FIG. 3A illustrates an example of a processing array with computational memory cells that may be incorporated into a semiconductor memory or computer system.

FIG. 3A illustrates an example of a processing array 30 with computational memory cells that may be incorporated into a semiconductor memory or computer system and may be connected to the storage array as described below. The processing array 30 may include an array of computational memory cells (cell 00, ..., cell 0n and cell m0, ..., cell mn). In one embodiment, the array of computational memory cells may be rectangular as shown in FIG. 3A and may have a plurality of columns and a plurality of rows wherein the computational memory cells in a particular column may also be connected to the same read bit line (RBL). The processing array 30 may further include a wordline (WL) generator and read/write logic control circuit 32 that may be connected to and generate signals for the read word line (RE) and write word line (WE) for each memory cell (such as R0, ..., REn and WE0, ..., WEn) to control the read and write operations as well known and one more read/write blocks 34 that are connected to the read and write bit lines of the computational memory cells. In the embodiment shown in FIG. 3A, the processing array may have read/write circuitry 34 for each set of bit line signals of the computational memory cells. For example, BL0 read/write logic 340 may be coupled to the read and write bit lines (WBLb0, WBL0 and RBL0) for the computational memory cells in column 0 of the array and BLn read/write logic 34n may be coupled to the read and write bit lines (WBLbn, WBLn and RBLn) for the computational memory cells in column n of the array as shown in FIG. 3A.

The wordline (WL) generator and read/write logic control circuit 32 may also generate one or more control signals that control the read/write circuitry 34. For example, for the different embodiments of the read/write logic, the one or more control signals may include a Read_Done control signal, an XORacc_En control signal, an ANDacc_En control signal and an ORacc_En control signal. Note that for each different embodiment, a different one or more of the control signals is used so that the wordline (WL) generator and read/write logic control circuit 32 may generate different control signals for each embodiment or the wordline (WL) generator and read/write logic control circuit 32 may generate each of the control signals, but then only certain of the control signals or all of the control signals may be utilized as described in the above incorporated by reference co-pending patent application.

During a read operation, the wordline (WL) generator and read/write logic control circuit 32 may activate one or more word lines that activate one or more computational memory cells so that the read bit lines of those one or more computational memory cells may be read out. Further details of the read operation are not provided here since the read operation is well known.

Figure 3B:
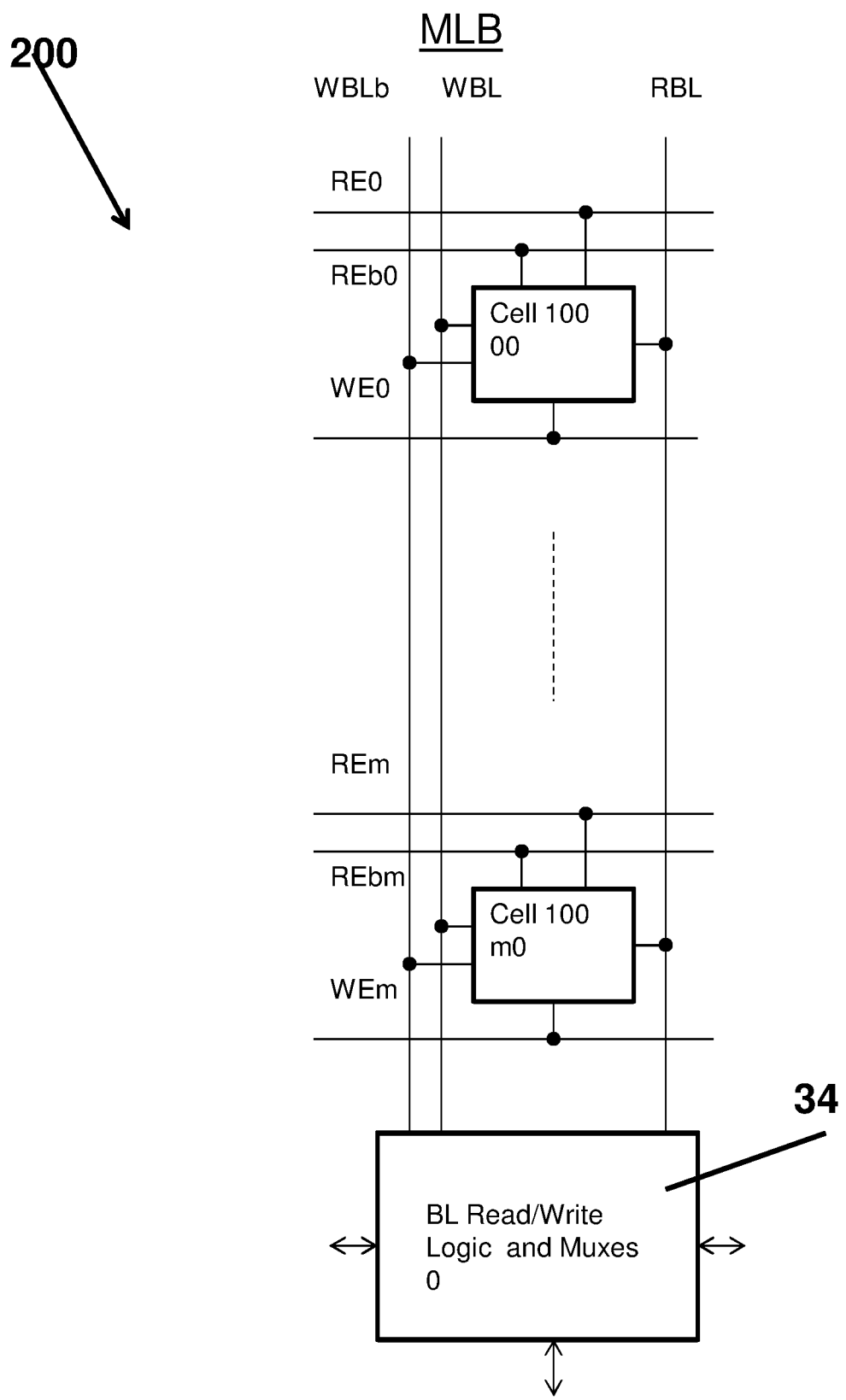
FIG. 3B illustrates a memory logic block portion of the processing array.
Figure 3C:
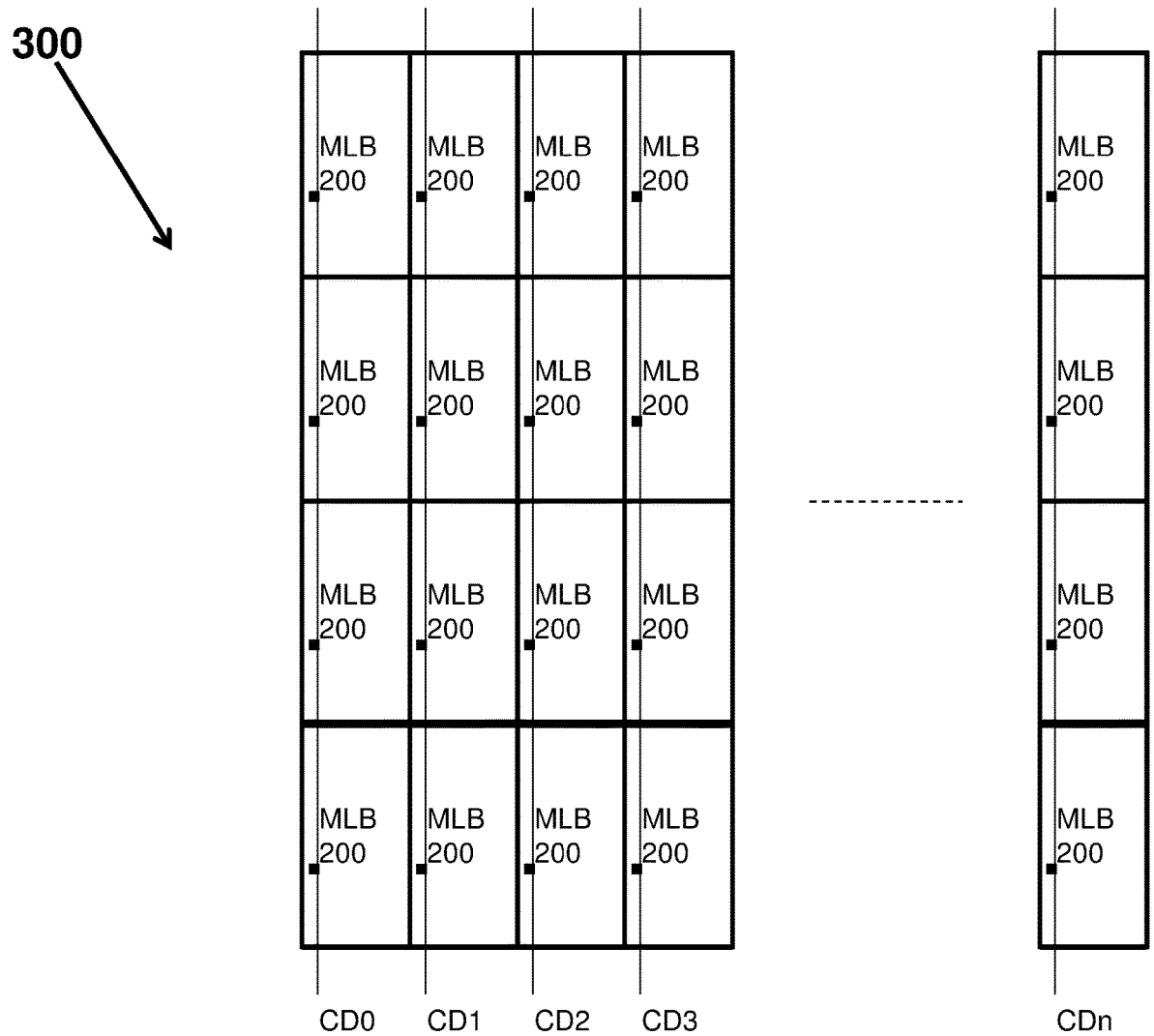
FIG. 3C illustrates the processing array with multiple memory logic blocks.

FIG. 3B illustrates a memory logic block ("MLB") portion 200 of the processing array. Each MLB 200 is a column of computational memory cells whose read bit lines (RBL) are all connected to a single read bit line that is input to the bit line read/write logic 34 of the MLB. FIG. 3C illustrates the processing array 300 with multiple memory logic blocks 200. The array 300 of MLBs has rows of MLBs and columns of MLBs. A column data (CDi) wire and signal connects the data outputs of the column of MLBs 200 such that data can be transferred from one MLB to another MLB and between MLB to outside of the MLB using the read/write logic 34. In the example in FIG. 3C, each column of MLBs has its own CDi, such as CD0, CD1, ..., CDn). Each column data signal may carry computational data generated by the column of memory cells within each MLB 200 and each piece of column data may be computational data.

Figure 4:
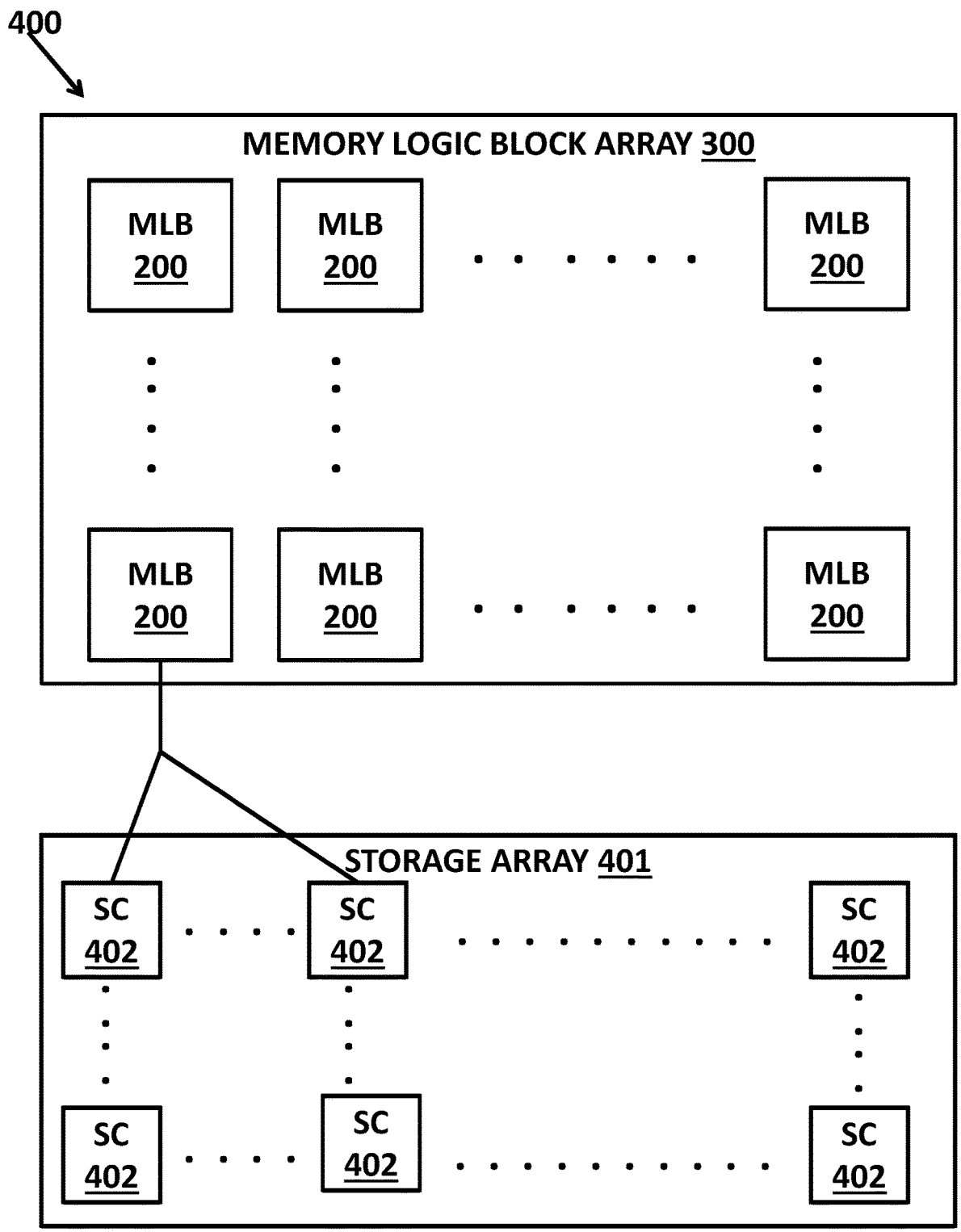
FIG. 4 illustrates circuitry of a device having a memory block logic array connected to a storage array.

FIG. 4 illustrates circuitry of a device 400 having a memory block logic array 300 connected to a storage array 401. The device 400 may be a single substrate or integrated circuit on which the memory block logic array 300 and the storage array 401 are formed. Alternatively, the device may be multiple substrates or integrated circuits in which the memory block logic array 300 is formed on one substrate or integrated circuit and the storage array 401 is formed on one substrate or integrated circuit and then the memory block logic array 300 and the storage array 401 are connected to each other.

The MLBs 200 are formed in an array having a plurality of columns and a plurality of rows as shown in FIG. 4. In one embodiment, the MLBs 200 may be formed into a rectangular array. Each MLB 200 may be connected to at least one other MLB 200 to perform logic functions as described above. In one embodiment, the MLBs 200 may be connected column-wise to each other as shown in FIG. 4, but the MLBs 200 also may be connected row-wise.

The storage array 401 may have a plurality of storage cells (SC) 402. The SCs 402 may be formed in an array having a plurality of columns and a plurality of rows as shown in FIG. 4. In one embodiment, one or more columns of the SCs 402 may be connected to a column of the MLBs 200 as shown in FIG. 4. In different embodiments, there may be two columns of SCs 402 connected to a column of MLBs 200 or there may be four columns of SCs 402 connected to each column of MLBs 200. The SCs 402 may be formed into a rectangular array as shown in FIG. 4.

In a known device that does not have the storage array 401, it is necessary to use some of the memory cells in processing array 30 for computation and to use some of the cells for storage. However, each cell in the processing array 30 is a dual port SRAM cell with a cell size that is significant larger than the high density memories like Flash, DRAM and 6T SRAM cells. So, as shown in FIG. 4, it is advantageous to use high density memory for storage (the storage array 401) and to use computational memory cells (the MLB array 300) for logic operations and temporary storage, such as a XNOR operation of the read word line RE, together with complementary read word line, REb, and storage node D as RBL=XNOR (RE, D) (EQ1). If multiple cells are connected to a bit line as an MLB (Memory Logic Block) 200, the RBL can be shown as RBL=AND (XNOR (RE1, D1), XNOR (RE2, D2), . . . , XNOR(REi, Di)), where i is the number of active cell. (EQ2).

Figure 5A:
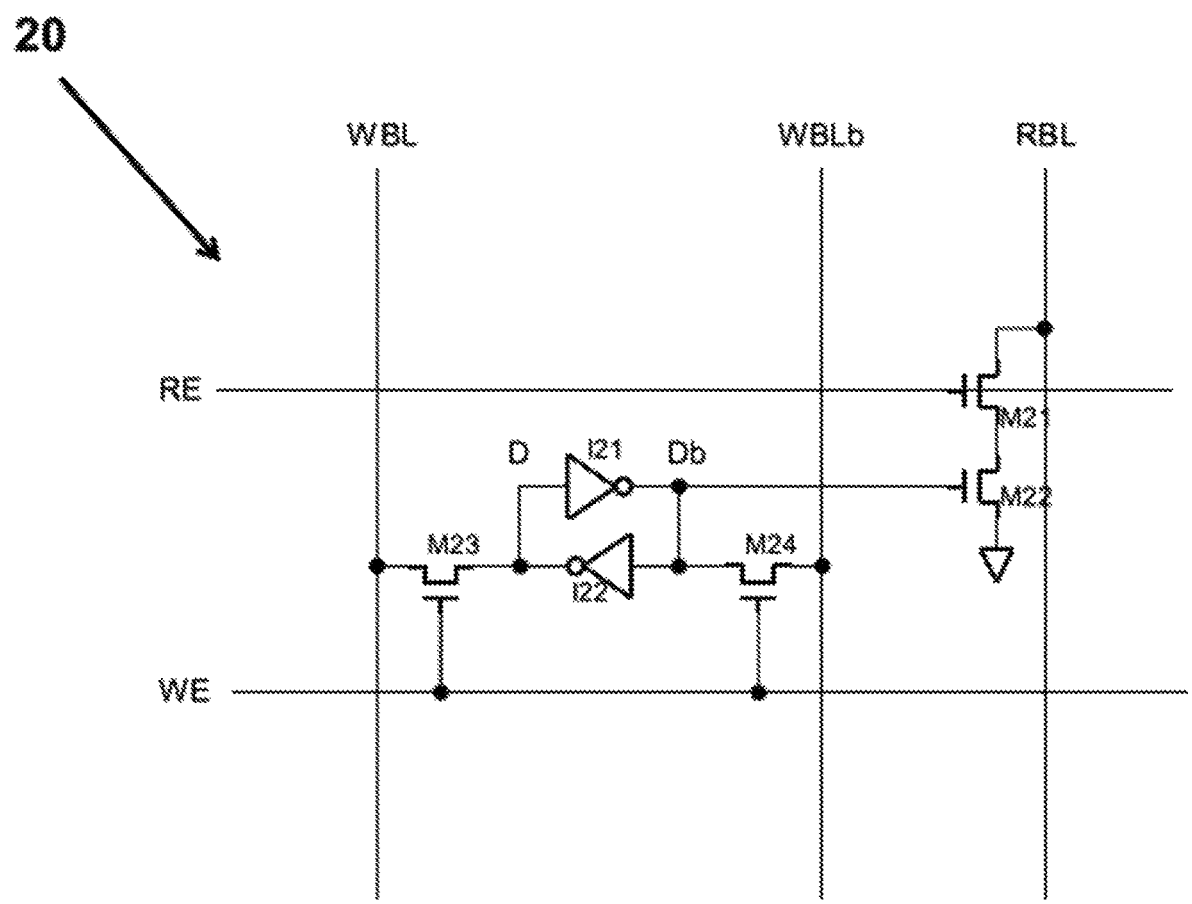
FIGS. 5A and 5B illustrate examples of two different types of computational memory cells that may be used in the memory logic blocks that are part of the semiconductor memory of FIG. 1, the computer system of FIG. 2 or the device of FIGS. 3A-3C and 4.
Figure 5B:
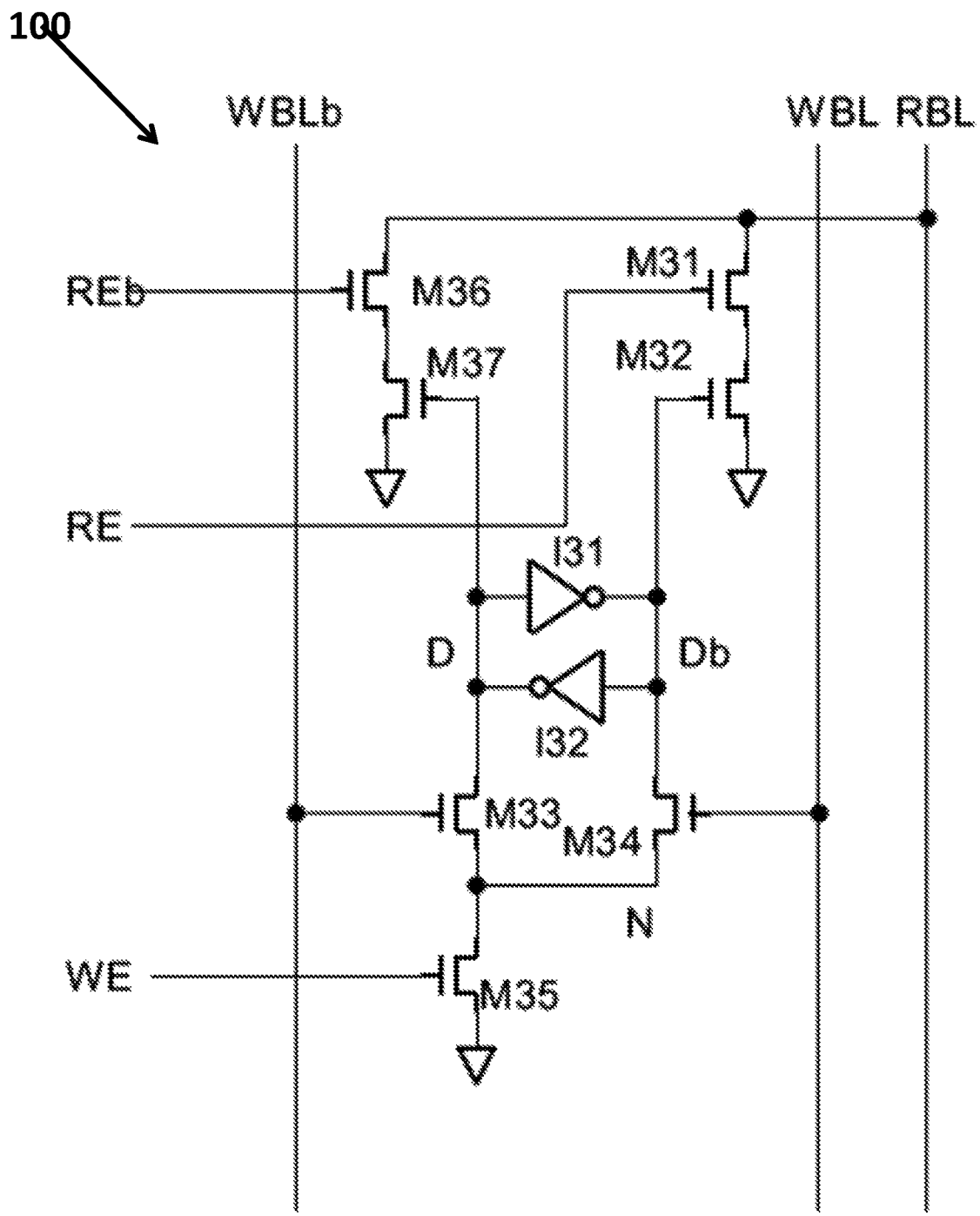

FIGS. 5A and 5B illustrate examples of two different types of computational memory cells that may be used in the memory logic blocks 200 that are part of the semiconductor memory of FIG. 1, the computer system of FIG. 2 or the device of FIGS. 3A-3C and 4. In the examples, the computational memory cell are based on an SRAM memory cell.

FIG. 5A illustrates an example of a dual port SRAM cell 20 that may be used for computation. The dual port SRAM cell may include two cross coupled inverters 121, 122 and two access transistors M23 and M24 that interconnected together to form a 6T SRAM cell. The SRAM may be operated as storage latch and may have a write port. The two inverters are cross coupled since the input of the first inverter is connected to the output of the second inverter and the output of the first inverter is coupled to the input of the second inverter as shown in FIG. 5A. A Write Word line carries a signal and is called WE and a write bit line and its complement are called WBL and WBLb, respectively. The Write word line WE is coupled to the gates of the two access transistors M23, M24 that are part of the SRAM cell. The write bit line and its complement (WBL and WBLb) are each coupled to one side of the respective access transistors M23, M24 as shown in FIG. 5A while the other side of each of those access transistors M23, M24 are coupled to each side of the cross coupled inverters (labeled D and Db in FIG. 5A.)

The circuit in FIG. 5A may also have a read word line RE, a read bit line RBL and a read port formed by transistors M21, M22 coupled to form as isolation circuit as shown. The read word line RE may be coupled to the gate of transistor M21 that forms part of the read port while the read bit line is coupled to the source terminal of transistor M21. The gate of transistor M22 may be coupled to the Db output from the cross coupled inverters 121, 122.

During reading, multiple cells (with only a single cell being shown in FIG. 5A) can turn on to perform an AND function. Specifically, at the beginning of the read cycle, RBL is pre-charged high and if the Db signal of all cells that are turned on by RE is "0", then RBL stays high since, although the gate of transistor M21 is turned on by the RE signal, the gate of M22 is not turned on and the RBL line is not connected to the ground to which the drain of transistor M22 is connected. If the Db signal of any or all of the cells is "1" then RBL is discharged to 0 since the gate of M22 is turned on and the RBL line is connected to ground. As a result, RBL=NOR (Db0, Db1, etc.) where Db0, Db1, etc. are the complementary data of the SRAM cells that have been turned on by the RE signal. Alternatively, RBL=NOR (Db0, Db1, etc.)=AND (D0, D1, etc.), where D0, D1, etc. are the true data of the cells that have been turned on by the RE signal.

As shown in FIG. 5A, the Db signal of the cell 20 may be coupled to a gate of transistor M22 to drive the RBL. However, unlike the typical 6T cell, the Db signal is isolated from the RBL line and its signal/voltage level by the transistors M21, M22. Because the Db signal/value is isolated from the RBL line and signal/voltage level, the Db signal is not susceptive to the lower bit line level caused by multiple "0" data stored in multiple cells in contrast to the typical SRAM cell. Therefore, for the cell in FIG. 5A, there is no limitation of how many cells can be turned on to drive RBL. As a result, the cell (and the device made up for multiple cells) offers more operands for the AND function since there is no limit of how many cells can be turned on to drive RBL. Furthermore, in the cell in FIG. 5A, the RBL line is pre-charged (not a static pull up transistor as with the typical 6T cell) so this cell can provide much faster sensing because the current generated by the cell is all be used to discharge the bit line capacitance with no current being consumed by a static pull up transistor so that the bit line discharging rate can be faster by more than 2 times. The sensing for the disclosed cell is also lower power without the extra current consumed by a static pull up transistor and the discharging current is reduced by more than half.

The write port of the cell in FIG. 5A is operated in the same manner as the 6T typical SRAM cell. As a result, the write cycle and Selective Write cycle for the cell have the same limitation as the typical 6T cell. In addition to the AND function described above, the SRAM cell 20 in FIG. 5A also may perform a NOR function by storing inverted data. Specifically, if D is stored at the gate of M22, instead of Db, then RBL=NOR (D0, D1, etc.). One skilled in the art understand that the cell configuration shown in FIG. 5A would be slightly altered to achieve this, but that modification is within the scope of the disclosure. Further details of this exemplary computational memory cell is found in co-pending U.S. patent application Ser. Nos. 15/709,379, 15/709,382 and 15/709,385 all filed on Sep. 19, 2017 and entitled "Computational Dual Port Sram Cell And Processing Array Device Using The Dual Port Sram Cells" which are incorporated herein by reference.

FIG. 5B illustrates an implementation of a dual port SRAM cell 100 with an XOR function. The dual port SRAM cell 100 may include two cross coupled inverters 131, 132 and two access transistors M33 and M34 that are interconnected together as shown in FIG. 5B to form the basic SRAM cell. The SRAM may be operated as storage latch and may have a write port. The two inverters 131, 132 are cross coupled since the input of the first inverter is connected to the output of the second inverter (labeled D) and the output of the first inverter (labeled Db) is coupled to the input of the second inverter as shown in FIG. 5B. The cross coupled inverters 131, 132 form the latch of the SRAM cell. The access transistor M33 and M34 may have their respective gates connected to write bit line and its complement (WBL, WBLb) respectively. A Write Word line carries a signal WE. The Write word line WE is coupled to the gate of a transistor M35 that is part of the access circuitry for the SRAM cell.

The circuit in FIG. 5B may also have a read word line RE, a read bit line RBL and a read port formed by transistors M31, M32 coupled together to form as isolation circuit as shown. The read word line RE may be coupled to the gate of transistor M31 that forms part of the read port while the read bit line RBL is coupled to the drain terminal of transistor M31. The gate of transistor M32 may be coupled to the Db output from the cross coupled inverters 131, 132. The isolation circuit isolates the latch output Db (in the example in FIG. 5B) from the read bit line and signal/voltage level so that the Db signal is not susceptive to the lower bit line level caused by multiple "0" data stored in multiple cells in contrast to the typical SRAM cell.

The cell 100 may further include two more read word line transistors M36, M37 and one extra complementary read word line, REb. When the read port is active, either RE or REb is high and the REb signal/voltage level is the complement of RE signal/voltage level. RBL is pre-charged high, and if one of (M31, M32) or (M36, M37) series transistors is on, RBL is discharged to 0. If none of (M31, M32) or (M36, M37) series transistors is on, then RBL stay high as 1 since it was precharged high. The following equation below, where D is the data stored in the cell and Db is the complement data stored in the cell, describes the functioning/operation of the cell:

$$RBL=AND(NAND(RE,Db),NAND(REb,D))=XNOR(RE,D) \quad (EQ1)$$

If the word size is 8, then it needs to be stored in 8 cells (with one cell being shown in FIG. 5B) on the same bit line. On a search operation, an 8 bit search key can be entered using the RE, REb lines of eight cells to compare the search key with cell data. If the search key bit is 1, then the corresponding RE=1 and REb=0 for that cell. If the search key bit is 0, then the corresponding RE=0 and REb=1. If all 8 bits match the search key, then RBL will be equal to 1. IF any 1 of the 8 bits is not matched, then RBL will be discharged and be 0. Therefore, this cell 100 (when used with 7 other cells for an 8 bit search key) can perform the same XNOR function but uses half the number of cell as the typical SRAM cell. The following equation for the multiple bits on the bit line may describe the operation of the cells as:

$$RBL=AND(XNOR(RE1,D1),XNOR(RE2,D2), \ldots ,XNOR(REi,Di)), \text{ where } i \text{ is the number of active cell.} \quad (EQ2)$$

By controlling either RE or REb to be a high signal/on, the circuit 100 may also be used to do logic operations mixing true and complement data as shown below:

$$RBL=AND(D1,D2,\ldots,Dn,Dbn+1,Dbn+2,\ldots Dbm) \quad (EQ3)$$

where D1, D2, ... Dn are "n" number of data with RE on and Dbn+1, Dbn+2, ... Dbm are m-n number of data with REb on.

Furthermore, if the cell 100 stores inverse data, meaning WBL and WBLb shown in FIG. 5B is swapped, then the logic equation EQ1 becomes XOR function and logic equation EQ3 becomes NOR a function and can be expressed as EQ 4 and EQ5

$$RBL=XOR(RE,D) \quad (EQ4)$$

$$RBL=NOR(D1,D2,\ldots,Dn,Dbn+1,Dbn+2,\ldots Dbm) \quad (EQ5)$$

where D1, D2, ... Dn are n number of data with RE on and Dbn+1, Dbn+2, ... Dbm are m-n number of data with REb on.

In another embodiment, the read port of the circuit 100 is FIG. 5B may be reconfigured differently to achieve different Boolean equation. Specifically, transistors M31, M32, M36 and M37 may be changed to PMOS and the source of M32 and M37 is VDD instead of VSS, the bit line is pre-charged to 0 instead of 1 and the word line RE active state is 0. In this embodiment, the logic equations EQ1 is inverted so that RBL is an XOR function of RE and D (EQ6). EQ3 is rewritten as an OR function (EQ7) as follows:

$$RBL=XOR(RE,D) \quad (EQ6)$$

$$RBL=OR(D1, D2, \ldots, Dn, Dbn+1, Dbn+2, \ldots Dbm) \quad (EQ7)$$

where D1, D2, ... Dn are n number of data with RE on and Dbn+1, Dbn+2, ... Dbm are m-n number of data with REb on.

If the cell stores the inverse data of the above discussed PMOS read port, meaning WBL and WBLb is swapped, then $$RBL=XNOR(RE,D) \quad (EQ8)$$

$$RBL=NAND(D1,D2,\ldots,Dn,Dbn+1,Dbn+2,\ldots Dbm) \quad (EQ9)$$

where D1, D2, ... Dn are n number of data with RE on and Dbn+1, Dbn+2, ... Dbm are m-n number of data with REb on.

For example, consider a search operation where a digital word needs to be found in a memory array in which the memory array can be configured as each bit of the word stored on the same bit line. To compare 1 bit of the word, then the data is stored in a cell and its RE is the search key Key, then EQ1 can be written as below:

$$RBL=XNOR(Key,D) \quad EQ10$$

If Key=D, then RBL=1. If the word size is 8 bits as D[0:7], then the search key Key[0:7] is its RE, then EQ2 can be expressed as search result and be written as below:

$$RBL=AND(XNOR(Key[0],D[0]),XNOR(Key[1],D[1], \ldots ,Key[7],D[7]) \quad EQ11$$

If all Key[i] is equal to D[i] where i=0-7, then the search result RBL is match. Any one of Key[i] is not equal to D[i], then the search result is not match. Parallel search can be performed in 1 operation by arranging multiple data words along the same word line and on parallel bit lines with each word on 1 bit line. Further details of this computation memory cell may be found in U.S. patent application Ser. Nos. 15/709,399 and 15/709,401 both filed on Sep. 19, 2017 and entitled "Computational Dual Port Sram Cell And Processing Array Device Using The Dual Port Sram Cells For Xor And Xnor Computations", which are incorporated herein by reference.

Figure 6:
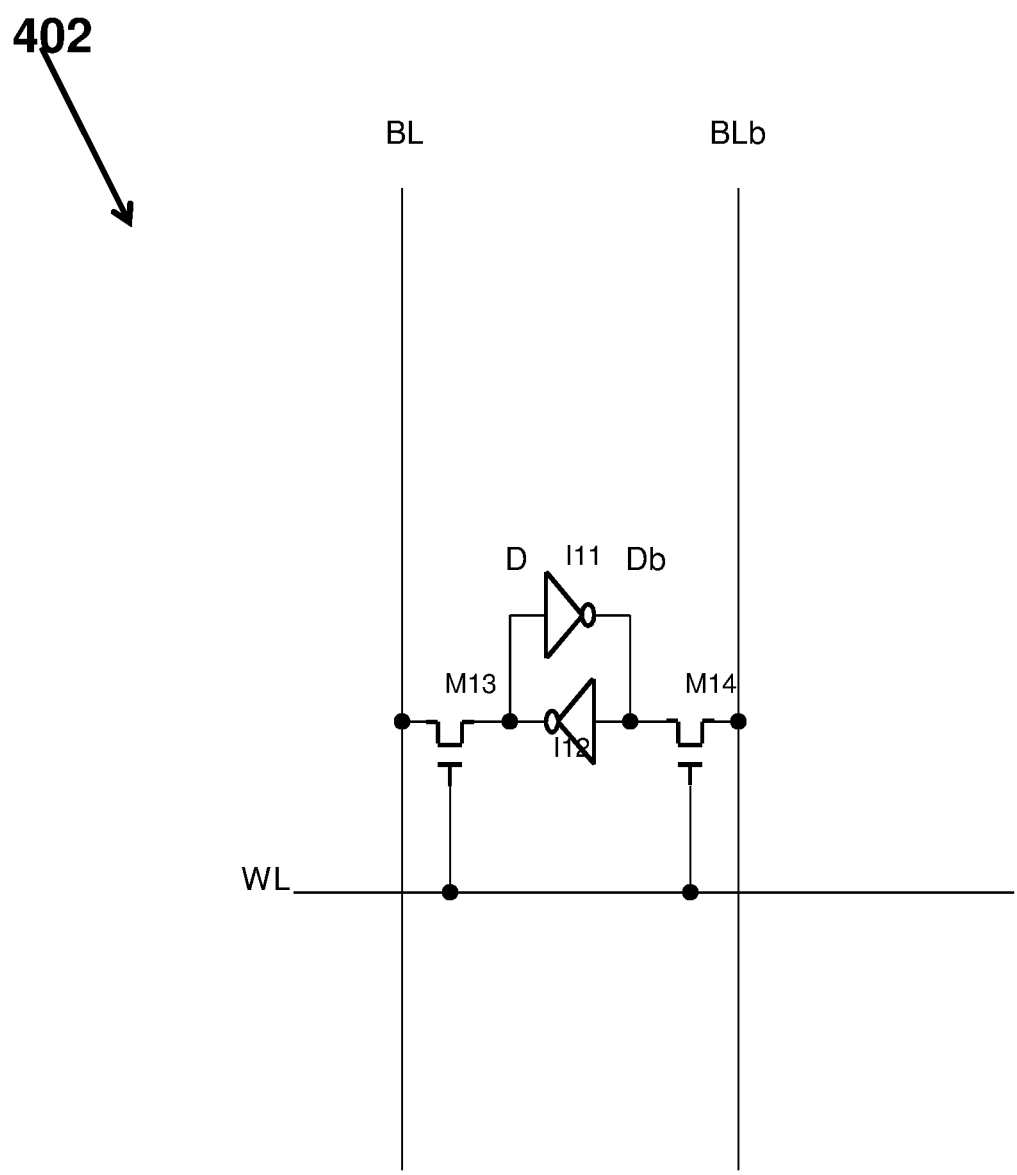
FIG. 6 illustrates an example of an SRAM cell that may be part of the storage array in FIG. 4.

FIG. 6 illustrates an example of an SRAM storage cell 402 that may be part of the storage array 400 in FIG. 4. In the example in FIG. 6, a typical 6T SRAM cell is shown. In other embodiments, the SC 402 may be other higher density storage cells like other SRAM cells, various DRAM cells, flash memory cells and the like and the disclosure is not limited to the 6T SRAM cell shown in FIG. 6. The 6T SRAM cell in FIG. 6 is well known and is commonly used as embedded memory for a logic chip since the cell size is very compact and is optimized for the process technology. In comparison, computational cells shown in FIGS. 5A and 5B has almost twice as many transistors and has much more word lines and bit lines. The 6T transistor storage cell shown in FIG. 4 has known elements and a known operation that is not described further herein.

Figure 7:
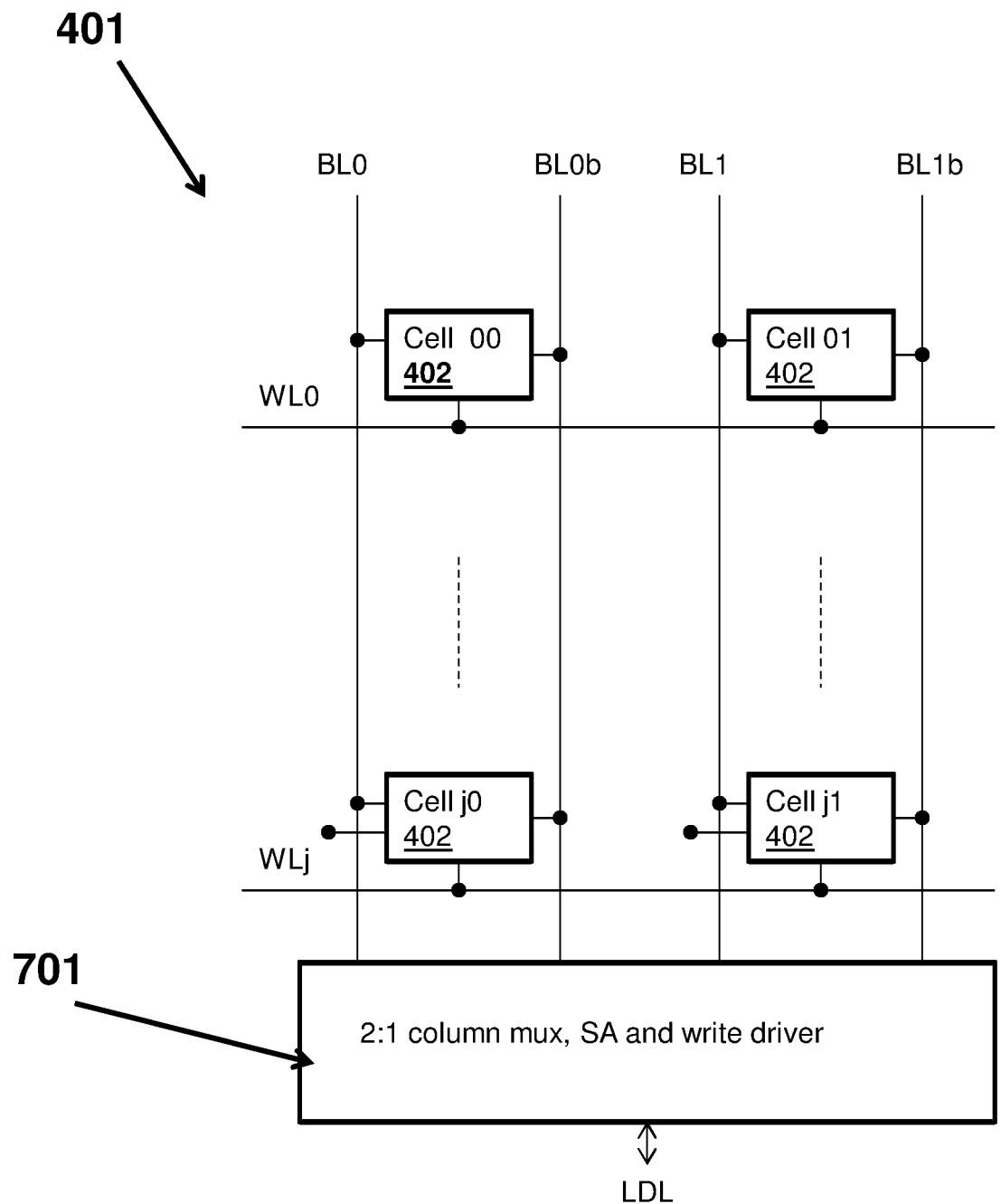
FIG. 7 illustrates a first embodiment of a portion of the storage array having two SRAM columns and a 2:1 multiplexer.
Figure 8:
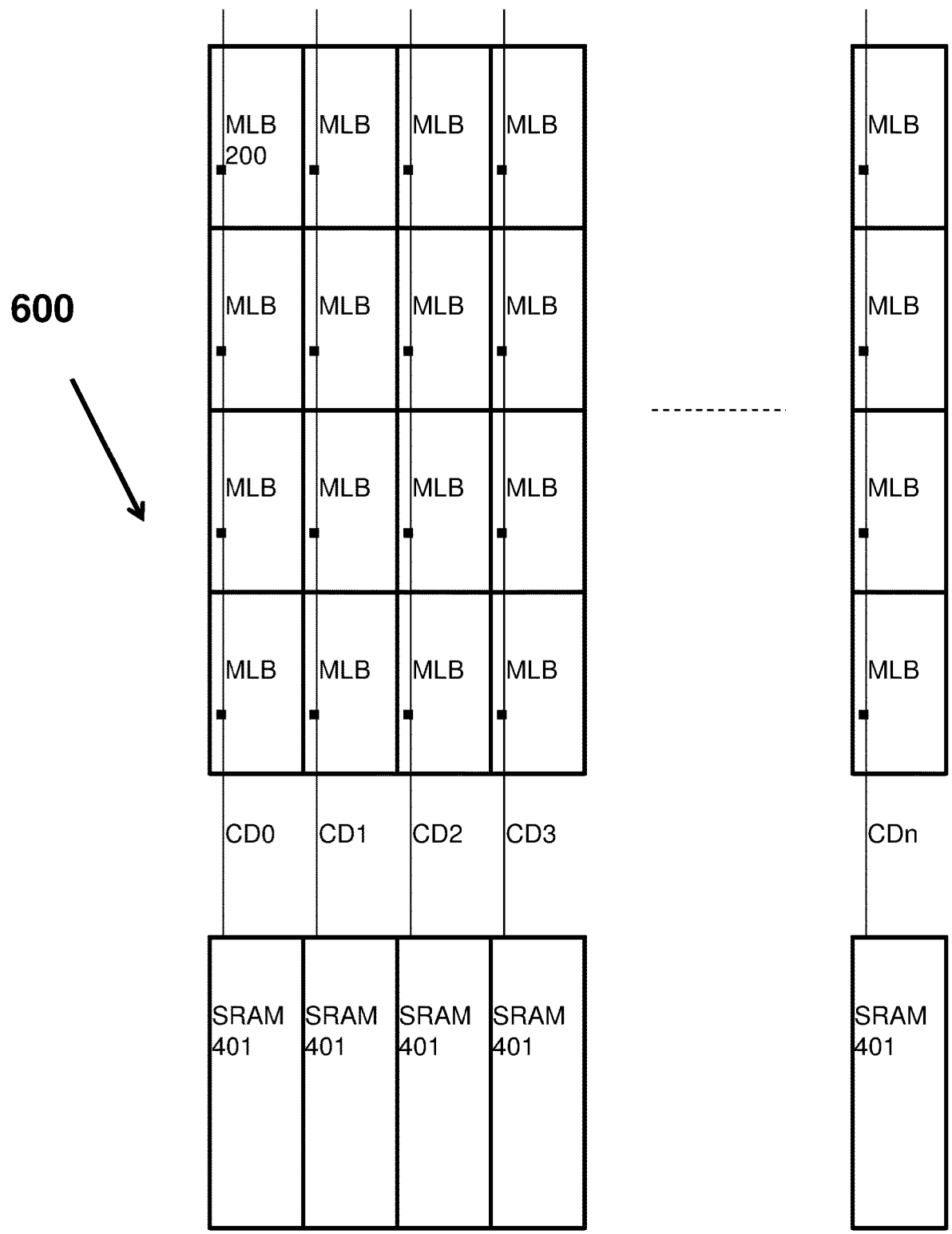
FIG. 8 illustrates an embodiment of the device having the memory logic blocks and the SRAM circuitry shown in FIG. 7.
Figure 9:
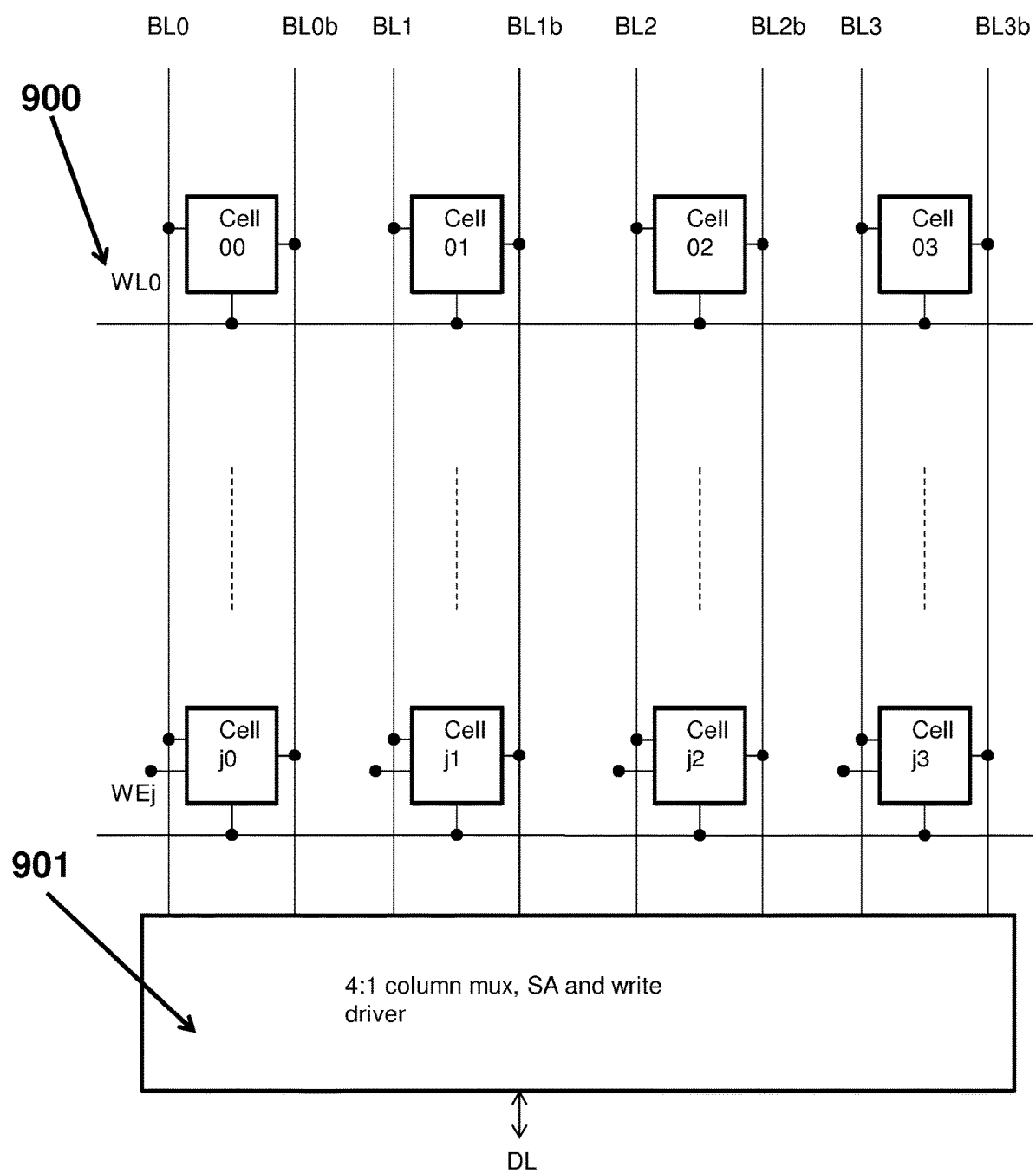
FIG. 9 illustrates a second embodiment of a portion of the storage array having four SRAM columns and a 4:1 multiplexer.
Figure 10:
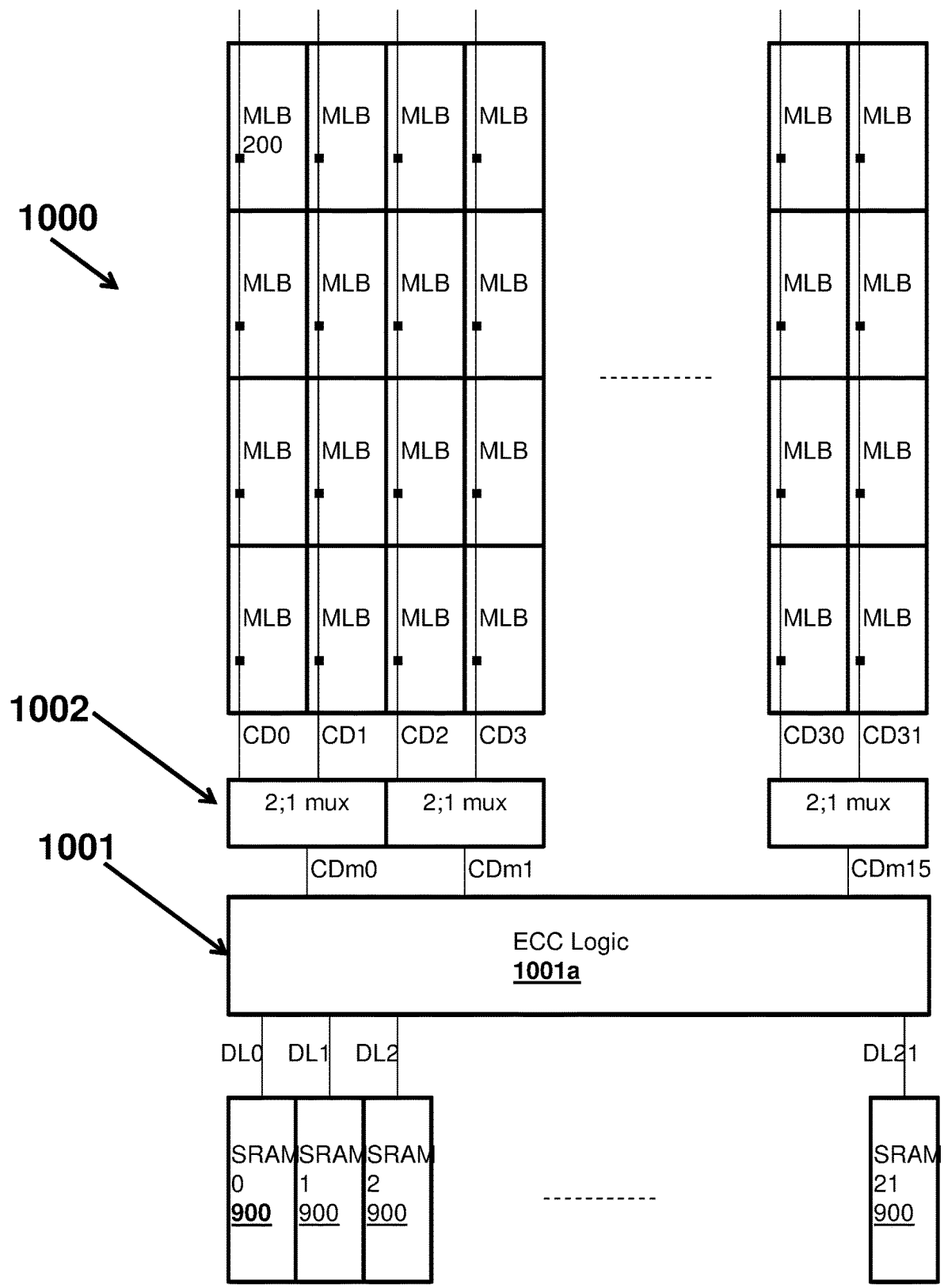
FIG. 10 illustrates a device having the processing array with the memory logic blocks with single error correction double error detection (SECDED) functionality.

FIG. 7 illustrates a first embodiment of a portion of the storage array 401 having two SRAM columns and a 2:1 multiplexer and FIG. 8 illustrates an embodiment of the device 600 having the memory logic blocks and the storage circuitry shown in FIG. 7. Since the cell size of each computational cell shown in FIG. 5A or 5B is 2 times or more larger than the cell size of the SC (an example of which is shown in FIG. 6), a length, in the column direction, of the computational cells can be designed to be 2 times or more of a length, in the column direction, of storage cells. Therefore it is suitable to have 1 MLB bit line with cells connected with 2 SRAM bit lines or more of storage cells as shown in FIGS. 7-10. FIGS. 7 and 8 show 2 columns of storage cells that connect to a column of MLBs while FIGS. 9 and 10 show 4 columns of storage cells that connect to a column of MLBs.

As shown in FIG. 7, in this embodiment, the storage array 401 has an array of 2 columns of SRAM bit line and cells 402 (cell 00, . . . cell j0 and cell 01, . . . , cell j1) and read/write bit line circuitry 701 that may include a known 2:1 multiplexer, a known sense amplifier (SA) and a known write driver connected to each other in a known manner. The bit lines of the two columns of the storage cells 402 may be decoded by the 2:1 column mux (multiplexer) and amplified by the Sense Amplifier (SA) to send the output signal to Local Data Line (LDL), or send the write data from LDL through 2:1 column mux to the bit line using the write driver. As described above, each 2-column block of SRAM 800 (an example of which is shown in FIG. 7) can be connected to 1 column of MLB array.

FIG. 9 illustrates a second embodiment of a portion of the storage array (a 4-column block of storage cells 900) having four SRAM cell columns (cell 00, . . . , cell j0, . . . , cell 03, . . . , cell j3, etc. as shown in FIG. 9) and having read/write circuitry 901 having a 4:1 multiplexer, sense amplifier and a write driver as described above. In this embodiment, the bit lines of the four columns of the storage cells may be decoded by the 4:1 column mux (multiplexer) and amplified by the Sense Amplifier (SA) to send the output signal to Data Line (DL), or send the write data from DL through 4:1 column mux to the bit line using the write driver. In FIG. 10, each 4-column block of SRAM 900 (an example of which is shown in FIG. 9) can be connected to 1 column of MLB array.

FIG. 10 illustrates a device 1000 having the processing array with the memory logic blocks with single error correction double error detection (SECDED) functionality. Soft Error Rate is an important consideration of memory design. Soft error happens when an alpha particle or a neutron hits the memory array to induce memory cells upset. To avoid soft error, a common technique is to implement an ECC (Error Correction Code) scheme. An ECC scheme stores parity bits along with data bits so that errors in the data bits may be corrected. For example, the SECDED (Single Error Correction Double Error Detection) scheme for 16 bits of data requires 6 parity bits. Therefore, 6 parity bits are generated and stored into memory along with 16 data bits. When read out, a parity decoder read 6 parity bits together with 16 data bits. If there is a 1 bit error, the 1 failed bit is corrected so that the 16 corrected data bits are sent out. If there is 2 bits of errors, then the SECDED circuitry sends out a warning signal to indicate the data is not correct. If there are 3 bits of errors, then the wrong data is read out without detection. Therefore, the readout data of SECDED scheme is preferable not to have 2 bits of error (in which the error is detected, but not corrected) and want to avoid 3 bits of errors.

A SECDED scheme can be implemented on the storage memory array with data bits and parity bits located on the same word line, or they are stored in the same row address. For example, a data word of 16 data bits requires 6 parity bits for SECDED scheme. 16 data bits and 6 parity bits are accessed to and from memory array in one cycle by the same row address.

For 16 nm or better process technology, MCU (Multiple Cell Upset) induced by Neutron or Alpha particles along the word line direction is around 2 cells. So if the data bits and parity bits located on the same word lines are next to each other and read out together, then we can have 2 bits of error. If the bits belonging to the same word are 2 or more bits apart, like arranged in 1000 of FIG. 10, SRAM 900 is used as storage memory array with 4:1 column mux. In each SRAM access only 1 of 4 adjacent bit lines are read, then it is on high confidence level MCU can be corrected and SECDED decoder can work properly.

As shown in FIG. 10, the device 1000 may be an MLB array connected to an ECC protected memory array 1001. The device 1000 includes an array of MLBs 200 that connects to an SRAM array with a plurality of storage cells 900. In FIG. 10, two MLB columns output column data lines (CDi and CDi+1), where i=0-30 (such as CD0 and CD1 as shown in FIG. 10) are decoded by a multiplexer 1002, such as 2:1 mux in this example, to get combined column data lines CDmn, where n=0-15 for a total of sixteen lines. The device in this example is using an SECDED scheme of a 16 data bits with 6 parity bits to form a ECC word. A set of known ECC circuitry 1001*a* (including logic) then encodes the 16 CDmn lines to SRAM data lines DL0-21 (a total of 22 SRAM data lines) to store into the storage cells 900 or the ECC circuitry 1001 may decode the DL0-21 lines to 16 combined column lines (CDm0-15) for the MLB array.

In this scheme, the length of the MLB cell is preferred to be designed such that the 16 MLB columns are approximately the length of 2 times of 22 SRAM columns, where 16 SRAM columns are for data and 6 are for parity. Therefore, the ratio of MLB column vs. SRAM column is approximately 2*22:16, or 44:16. A 4:1 column decoded SRAM 1000 is used to generate 22 data lines for an ECC word for a corresponding 16 MLB Column Data lines, CDmo-15. For the ratio of 44:16, the number of MLB column shall be 4*22/(44/16), or 32. Therefore 2 MLB columns can be multiplexed by a 2:1 mux 1002 so that 32 MLB columns to generate 16 column data lines, CDmn, n=0-15, on each access.

In this example of device 1000 in FIG. 10, the storage array with the storage cells 900 stores 16 data bits along with generated 6 parity bits into 22 blocks of storage cells 900 (SRAM0-SRAM 21). When the data is transferred from the storage array to the MLBs, 22 bits (16 data bits and 6 parity bits comprising DL0-21) may be read from the storage cells 900 into the ECC Logic 1001*a*. The ECC Logic 1001*a* decodes the 22 bits. If the 22 bits are correct or with 1 bit error, 16 bits, CDm0-15, are generated to send to MLB through the 2:1 mux 1002. When a computation result is generated by the MLB array to be stored into the storage array, the data is read out from the MLB block to generate 32 bits data on each access, CD0-31. The read out data is decoded by the 2:1 mux 1001a to generate 16 bits data CDm0-15 to ECC Logic 1001a.

The ECC Logic 1001a encodes 16 data bits to generate 6 parity bits in a known manner for a total of 22 bits (DL0-21) to store into the storage array.

The above example uses the SECDED scheme with 16 data bits. If an SEC scheme (without DED) is used, then only 5 parity bits is needed for 16 data bits. In this scheme, the MLB cells 200 need to be designed such that the ratio of the length of MLB column to the length of SRAM column is approximately 2*21:16, or 42:16. If it is SECDED scheme with 32 data bits, then 7 parity bits is needed and the MLB cell needs to be designed such that the ratio of the length of MLB column to the length of SRAM column is approximately 2*(32+7):32, or 78:32, or 39:16. In other words, the ratio of the length of MLB column to the length of SRAM column may be determined, for example, using the following formula:

$$\text{Ratio}=2*(D+P):D, D=\text{number of data bits}, P=\text{number of parity bits} \quad (EQ3)$$

Figure 11:
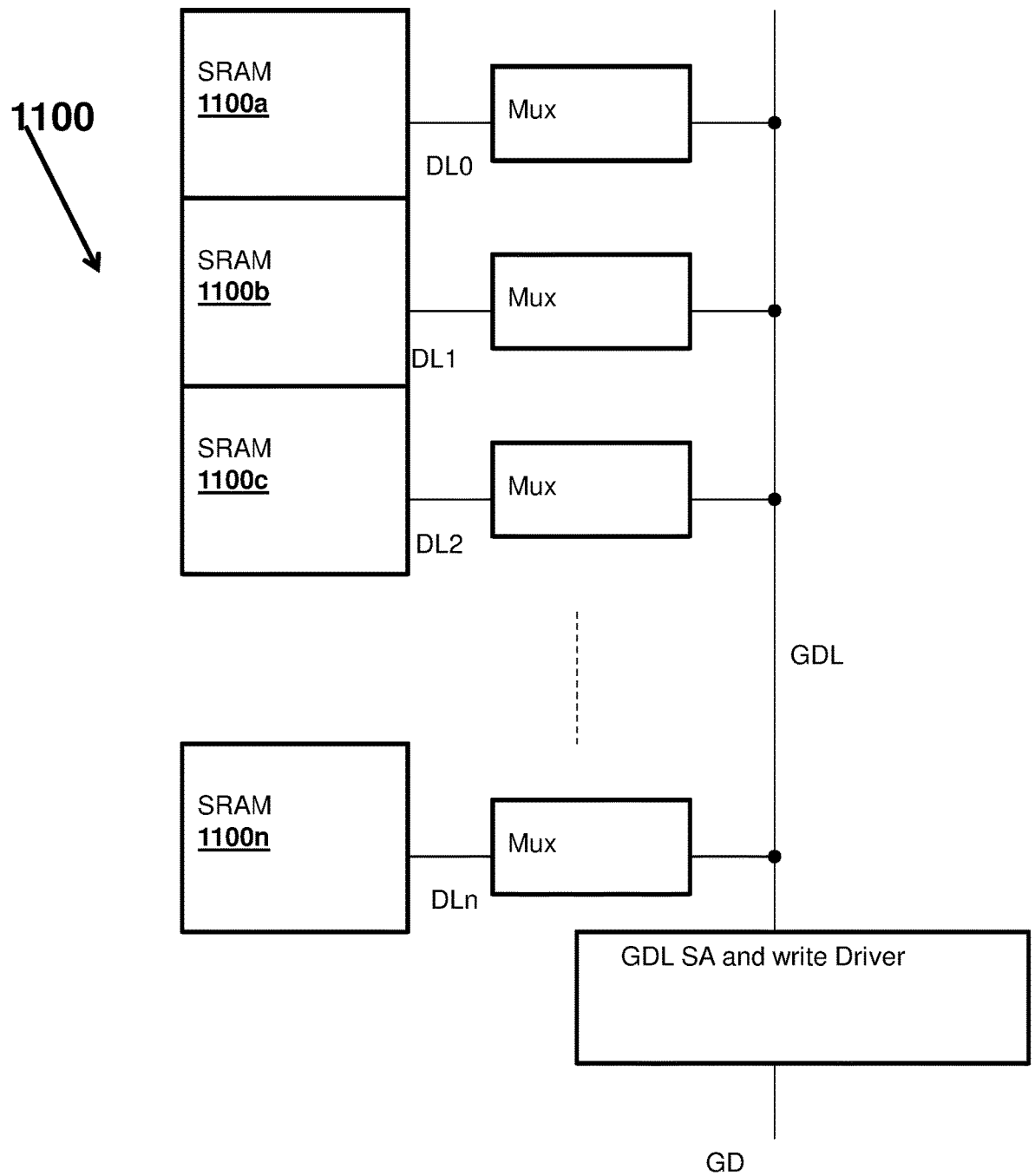
FIG. 11 illustrates an alternative embodiment of the four SRAM columns of the storage array having a hierarchical global data line (GDL)

To increase the density of storage array cell size for each MLB column, the storage array can be further improved with a hierarchical global data line scheme 1100 shown in FIG. 11. For high speed SRAM design, the bit line length is preferred to be short. For example, on 16 nm technology, it is preferred not to have more than 256 cells in a bit line. Therefore, to have higher density and also higher speed, the SRAM block 1110 can be arranged so that multiple storage cells, such as storage cells 1100a, . . . , 1100n, are on the same column with outputs DL0-n decoded to a Global Data Line (GDL) using a set of multiplexers. Each of storage cells 1100a, . . . , 1100n can be arranged as memory array 900 in FIG. 9. The GDL is running a much longer distance, the length of N storage cell bit lines. However, GDL can use much wider and thicker metal line than the bit line for a single storage cell and the device loading connected to GDL is less, therefore, the delay associated with GDL is much less than bit line.

Figure 12:
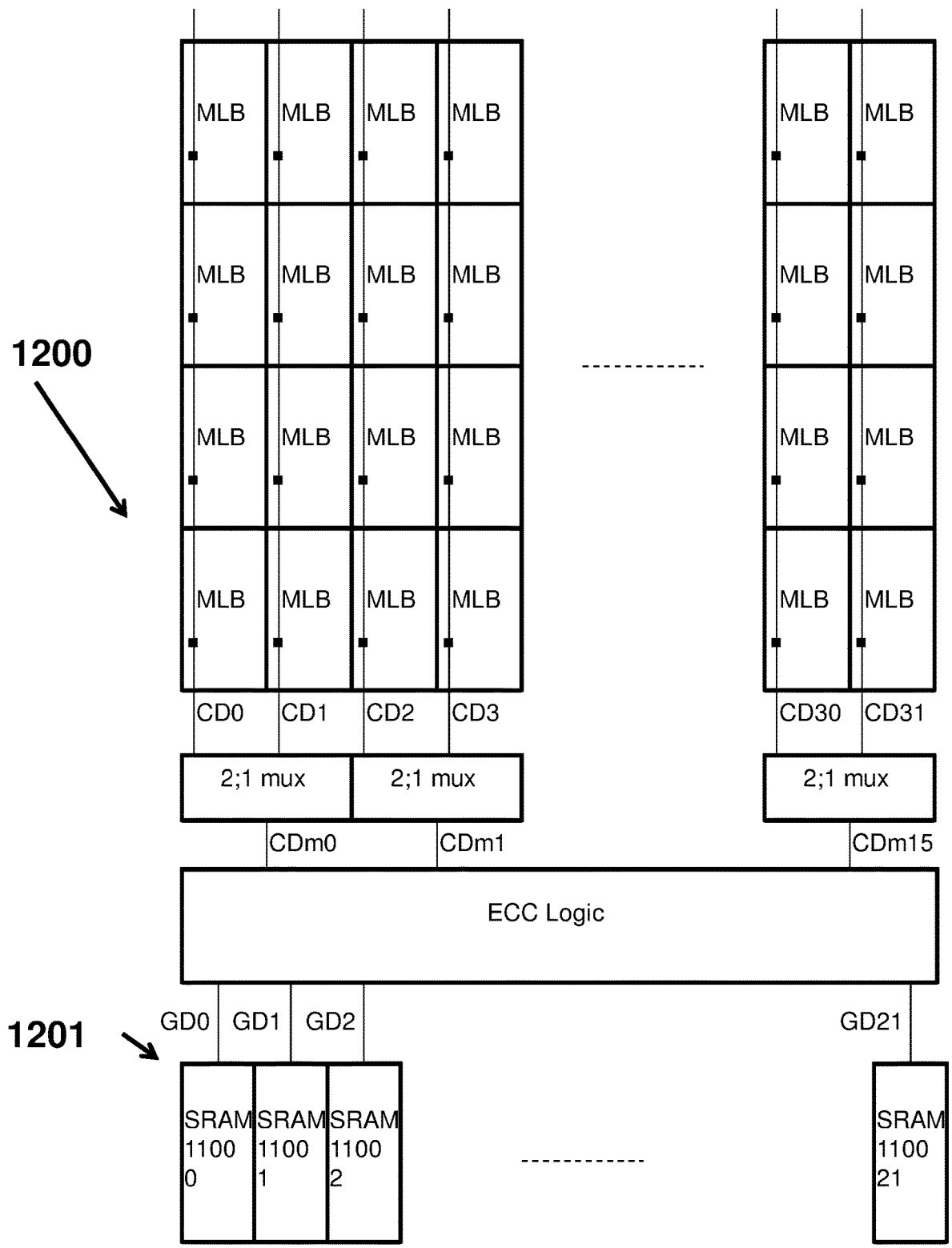
FIG. 12 illustrates a device having the processing array with the hierarchical memory logic blocks with single error correction double error detection (SECDED) functionality.

FIG. 12 illustrates an embodiment of the device 1200 with an MLB array connected to a hierarchical storage array 1100. In this embodiment, two MLB columns CDi and CDi+1, where i=0-31 are decoded by a 2:1 mux to get CDmn, where n=0-15. The ECC logic is then encoding 16 CDmn lines to a set of storage array global data lines, GD0-21, to store into the storage array or the ECC logic is then decoding GD0-22 SRAM lines to CDm0-15 16 lines for MLB array.

Figure 13:
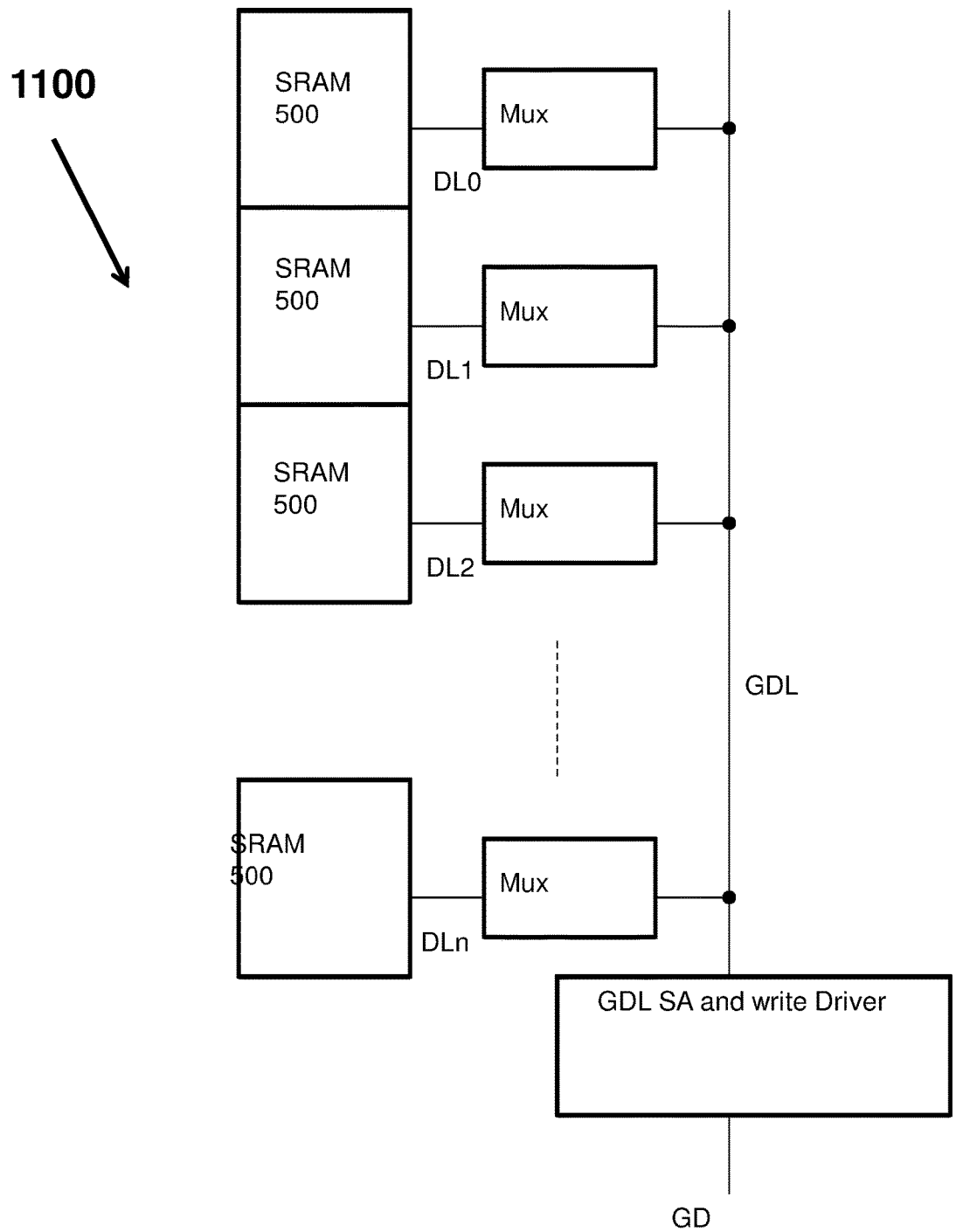
FIG. 13 illustrates another alternative embodiment of two SRAM columns of the storage array having a hierarchical global data line (GDL)
Figure 14:
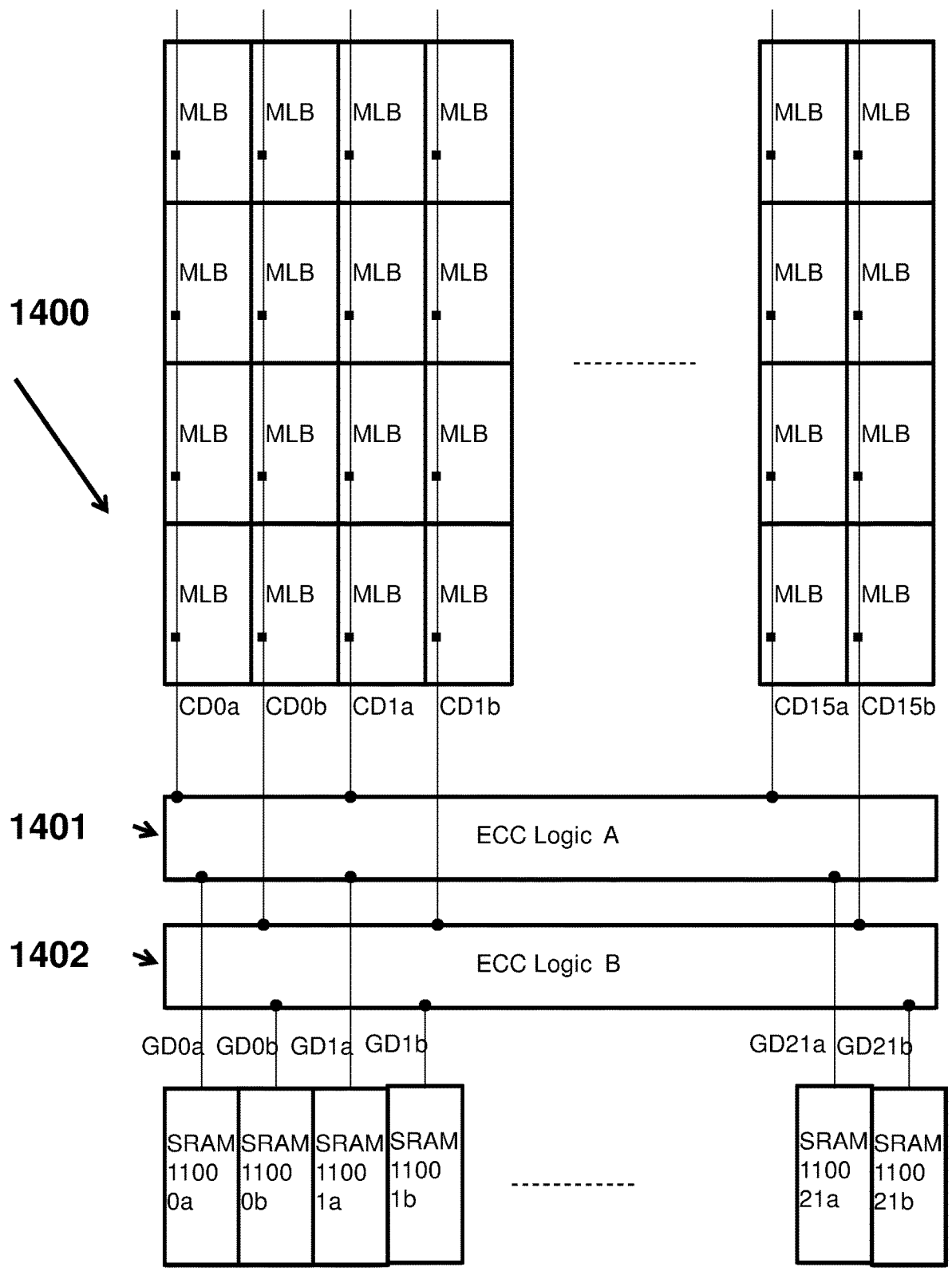
FIG. 14 illustrates a device having the processing array with the memory logic blocks with dual single error correction double error detection (SECDED) functionality.

FIG. 13 illustrates another alternative embodiment of two SRAM columns of the storage array having a hierarchical global data line (GDL) and FIG. 14 illustrates a device having the processing array with the memory logic blocks with dual single error correction double error detection (SECDED) functionality. As shown in FIG. 14, instead of going through the 2:1 muxes, the MLB Column Data (CD0a-15a, CD0b-15b) can feed into 2 sets of ECC logic 1401, 1402. Sixteen CD lines, CD0a-CD15a, feed into ECC logic A 1401 and another sixteen CD lines, CD0b-15b, feed into ECC Logic b 1402. On the other side of ECC logic, GD0a-21a and GD0b-GD21b then feed into 2 sets of storage cell column 0a-21a and 0b-21b. In this manner, the neighboring storage array column in each ECC group, a or b, is maintaining 4 columns apart, similar to embodiment described above. However, in this embodiment, the data bandwidth of MLB in the device 1400 is 2 times that of the one FIG. 12 due to the two sets of ECC logic.

In FIGS. 12 and 14, each storage cell that is preferably implemented using SRAM may also be implemented using other types of storage cells such as Flash or DRAM memories. The computational cell used in MLB in FIGS. 12 and 14 may be designed such that the ratio of the length of MLB column to the length of storage cell column may be determined using the following equation:

$$\text{Ratio}=N*(D+P):D \quad (EQ4)$$

where N=Approximate ratio of storage memory cell number to computational cell number, D=number of data bits, P=number of parity bits.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include an/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that performs particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A device comprising:
an array of computational memory cells having a plurality of memory logic blocks, wherein each memory logic block includes a column of computational memory cells and each computational memory cell in each column of computational memory cells has a storage element and a read bit line that is connected to a single read bit line of the column of computational memory cells, wherein each column of computational memory cells performs a computation operation when a first computational memory cell is coupled to a second computational memory cell in the column of computational memory cells and a result of the computation operation is on the single read bit line of the column of computational memory cells connecting the first computational memory cell and the second computational memory cell, wherein the computation operation results for two or more columns of computational memory cells are output on a data line common to the two or more columns of computational memory cells;
an array of storage cells, connected to the array of computational memory cells by the common data line, having a plurality of columns, wherein each storage cell has a higher density than the computational memory cell and has a storage element and each column of storage cells is connected to a bit line and a complementary bit lines for each cell in the column of storage cells; and
wherein two or more columns of the computational memory cells are coupled to a column of the storage cells by the common data line.

2. The device of claim 1, wherein the array of storage cells has a plurality of rows, wherein each storage cell in each row has a word line wherein a data bit and one or more parity bits for error correction of the computation memory cells are stored on the storage cells connected to the same word line.

3. The device of claim 1, wherein the array of storage cells further comprises at least two columns of the storage cells wherein each column has a bit line and a complementary bit line connected to the storage element of each storage cell in the column and wherein the bit lines and complementary bit lines of the at least two columns of storage cells are connected to a multiplexer whose output is connected to the column of memory logic blocks.

4. The device of claim 3, wherein the multiplexer further comprises a 2:1 multiplexer that combines the data from the at least two columns of storage cells.

5. The device of claim 3, wherein the at least two columns of storage cells further comprises four columns of storage cells and wherein the multiplexer further comprises a 4:1 multiplexer that combines the data from the four columns of storage cells.

6. The device of claim 3, wherein the array of storage cells further comprises an error correction code (ECC) circuitry that receives data from the at least two columns of storage cells and outputs data to the multiplexer.

7. The device of claim 6, wherein the ECC implements a single error correction, double error detection scheme.

8. The device of claim 6, wherein the ECC implements a single error correction scheme.

9. The device of claim 1, wherein the array of storage cells further comprises at least four columns of the storage cells wherein each column has a bit line and a complementary bit line connected to the storage element of each storage cell in the column and wherein the bit lines and complementary bit lines of the at least four columns of storage cells are connected to a first error correction circuitry logic and a second error correction circuitry logic that are connected to the column of memory logic blocks.

10. The device of claim 9, wherein the first and second error correction circuitry implement a single error correction, double error detection scheme.

11. The device of claim 9, wherein the first and second error correction circuitry implements a single error correction scheme.

12. The device of claim 1, wherein each computational memory cell further comprises a static random access memory cell having the storage element and read bit line protection circuitry that protects data stored in the storage element from disruption by the read bit line.

13. The device of claim 1, wherein each column of the storage array has a global data line that is connected to a multiplexer that is connected to each storage cell.

14. The device of claim 1, wherein the array of computational memory cells and the array of storage cells are integrated onto a single substrate.

15. The device of claim 1, wherein the array of computational memory cells and the array of storage cells are integrated onto a single integrated circuit.

16. The device of claim 1, wherein each cell in the storage array is one of a six transistor static random access memory cell, a dynamic random access memory cell and a flash memory cell.

17. A device, comprising:
an integrated circuit;
an array of computational memory cells formed on the integrated circuit, the array having a plurality of memory logic blocks, wherein each memory block includes a column of computational memory cells and each computational memory cell in each column of computational memory cells has a storage element and a read bit line that is connected to a single read bit line of the column of computational memory cells, wherein each column of computational memory cells performs a computation operation when a first computational memory cell is coupled to a second computational memory cell in the column of computational memory cells and a result of the computation operation is on the single read bit line of the column of computational memory cells connecting the first computational memory cell and the second computational memory cell, wherein the computation operation results for two or more columns of computational memory cells are output on a data line common to the two or more columns of computational memory cells;
an array of storage cells formed on the integrated circuit connected to the array of computational memory cells by the common data line and having a plurality of columns, wherein each storage cell has a higher density than the computational memory cell and has a storage element and each column of storage cells is connected to a bit line and a complementary bit lines for each cell in the column of storage cells; and
wherein two or more columns of the computational memory cells are coupled to a column of the storage cells by the common data line.

18. The device of claim 17, wherein the array of storage cells has a plurality of rows, wherein each storage cell in each row has a word line wherein a data bit and one or more parity bits for error correction of the computation memory cells are stored on the storage cells connected to the same word line.

19. The device of claim 17, wherein the array of storage cells further comprises at least two columns of the storage cells wherein each column has a bit line and a complementary bit line connected to the storage element of each storage cell in the column and wherein the bit lines and complementary bit lines of the at least two columns of storage cells are connected to a multiplexer whose output is connected to the column of memory logic blocks.

20. The device of claim 19, wherein the multiplexer further comprises a 2:1 multiplexer that combines the data from the at least two columns of storage cells.

21. The device of claim 19, wherein the at least two columns of storage cells further comprises four columns of storage cells and wherein the multiplexer further comprises a 4:1 multiplexer that combines the data from the four columns of storage cells.

22. The device of claim 19, wherein the array of storage cells further comprises an error correction code (ECC) circuitry that receives data from the at least two columns of storage cells and outputs data to the multiplexer.

23. The device of claim 22, wherein the ECC implements a single error correction, double error detection scheme.

24. The device of claim 22, wherein the ECC implements a single error correction scheme.

25. The device of claim 17, wherein the array of storage cells further comprises at least four columns of the storage cells wherein each column has a bit line and a complementary bit line connected to the storage element of each storage cell in the column and wherein the bit lines and complementary bit lines of the at least four columns of storage cells are connected to a first error correction circuitry logic and a second error correction circuitry logic that are connected to the column of memory logic blocks.

26. The device of claim 25, wherein the first and second error correction circuitry implement a single error correction, double error detection scheme.

27. The device of claim 25, wherein the first and second error correction circuitry implements a single error correction scheme.

28. The device of claim 17, wherein each computational memory cell further comprises a static random access memory cell having the storage element and read bit line protection circuitry that protects data stored in the storage element from disruption by the read bit line.

29. The device of claim 17, wherein each column of the storage array has a global data line that is connected to a multiplexer that is connected to each storage cell.

30. The device of claim 17, wherein the array of computational memory cells and the array of storage cells are integrated onto a single substrate.

31. The device of claim 17, wherein the array of computational memory cells and the array of storage cells are integrated onto a single integrated circuit.

32. The device of claim 17, wherein each cell in the storage array is one of a six transistor static random access memory cell, a dynamic random access memory cell and a flash memory cell.

* * * * *